United States Patent
Davies et al.

(10) Patent No.: US 11,177,145 B2
(45) Date of Patent: Nov. 16, 2021

(54) APPARATUS AND METHOD FOR MANUFACTURING PLURALITY OF ELECTRONIC CIRCUITS

(71) Applicant: PRAGMATIC PRINTING LTD., Sedgefield (GB)

(72) Inventors: Neil Davies, Sedgefield (GB); Richard Price, Sedgefield (GB); Stephen Devenport, Sedgefield (GB); Stuart Speakman, Sedgefield (GB)

(73) Assignee: PRAGMATIC PRINTING LTD., Sedgefield (GB)

( * ) Notice: Subject to any disclaimer, the term of this patent is extended or adjusted under 35 U.S.C. 154(b) by 6 days.

(21) Appl. No.: 16/621,387

(22) PCT Filed: Jun. 18, 2018

(86) PCT No.: PCT/GB2018/051675
§ 371 (c)(1),
(2) Date: Dec. 11, 2019

(87) PCT Pub. No.: WO2018/234768
PCT Pub. Date: Dec. 27, 2018

(65) Prior Publication Data
US 2020/0176287 A1    Jun. 4, 2020

(30) Foreign Application Priority Data

Jun. 19, 2017 (GB) .................................. 1709749

(51) Int. Cl.
*H01L 21/67* (2006.01)
*H01L 25/00* (2006.01)

(52) U.S. Cl.
CPC .. *H01L 21/67144* (2013.01); *H01L 21/67132* (2013.01); *H01L 25/50* (2013.01)

(58) Field of Classification Search
CPC ......... H01L 21/67144; H01L 21/67132; H01L 25/50
See application file for complete search history.

(56) References Cited

U.S. PATENT DOCUMENTS

| | | | |
|---|---|---|---|
| 2004/0154161 A1 | 8/2004 | Aoyama et al. | |
| 2007/0183184 A1* | 8/2007 | Nakamura | H01L 24/81 365/149 |

(Continued)

FOREIGN PATENT DOCUMENTS

| | | |
|---|---|---|
| EP | 1746636 A1 | 1/2007 |
| GB | 2549250 A | 10/2017 |

(Continued)

OTHER PUBLICATIONS

International Search Report for International Application No. PCT/GB2018/051675, dated Sep. 27, 2018.

(Continued)

*Primary Examiner* — Zandra V Smith
*Assistant Examiner* — Andre C Stevenson
(74) *Attorney, Agent, or Firm* — Jason H. Vick; Sheridan Ross, PC

(57) ABSTRACT

A method of manufacturing a plurality of electronic circuits is disclosed. Each electronic circuit comprises a respective first portion, comprising a respective group of contact pads, and a respective integrated circuit, IC, comprising a respective group of terminals and mounted on the respective group of contact pads with each terminal in electrical contact with a respective contact pad. The method comprises: providing a first structure comprising the plurality of first portions; providing a second structure comprising the plurality of ICs and a common support arranged to support the plurality of ICs; transferring said ICs from the common support onto a first roller having a removable surface portion; and transferring said ICs from the first roller onto the first structure (Continued)

such that each group of terminals is mounted on a respective group of contact pads.

20 Claims, 6 Drawing Sheets

(56) References Cited

U.S. PATENT DOCUMENTS

| | | | |
|---|---|---|---|
| 2007/0190691 A1* | 8/2007 | Humpston | H01L 23/10 438/113 |
| 2012/0118506 A1 | 5/2012 | Kim et al. | |
| 2014/0259633 A1 | 9/2014 | Okandan et al. | |

FOREIGN PATENT DOCUMENTS

| | | |
|---|---|---|
| JP | 2005-149130 | 6/2005 |
| JP | 2005-215754 A | 8/2005 |
| WO | WO 2014/091192 | 6/2014 |

OTHER PUBLICATIONS

Written Opinion for International Application No. PCT/GB2018/051675, dated Sep. 27, 2018.
Search Report for Great Britain Patent Application No. GB 1709749.4, dated Dec. 18, 2017.

* cited by examiner

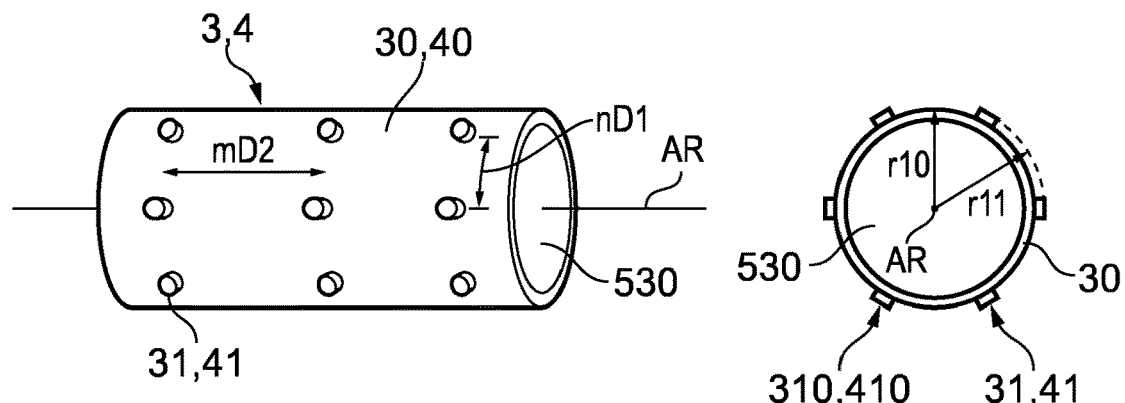
FIG. 5
FIG. 6
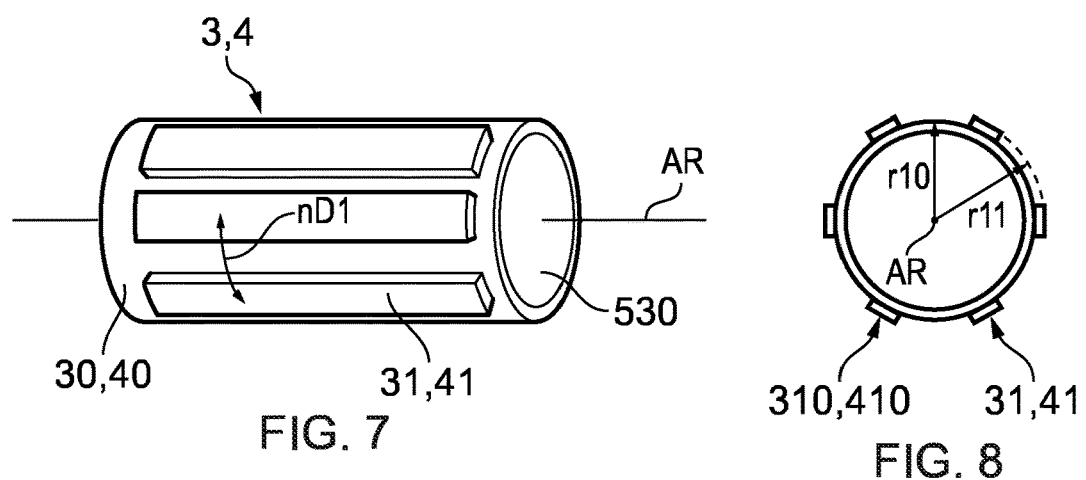
FIG. 7
FIG. 8
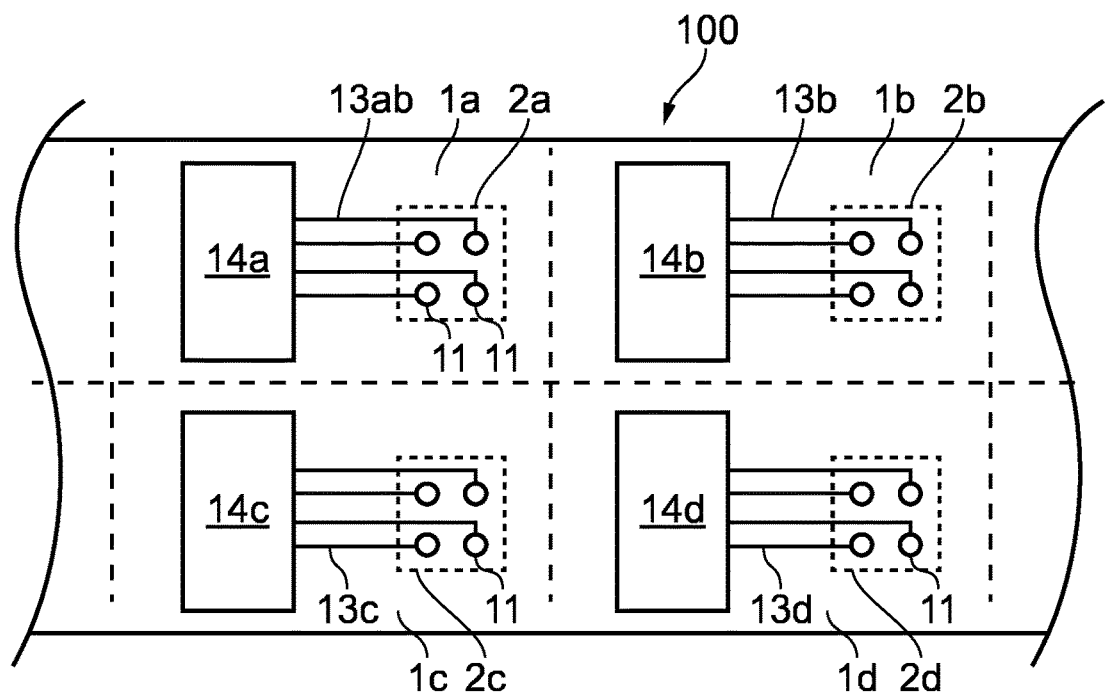
FIG. 11

APPARATUS AND METHOD FOR MANUFACTURING PLURALITY OF ELECTRONIC CIRCUITS

CROSS REFERENCE TO RELATED APPLICATIONS

This application is a national stage application under 35 U.S.C. 371 of PCT Application No. PCT/GB2018/051675, having an international filing date of 18 Jun. 2018, which designated the United States, which PCT application claimed the benefit of Great Britain Application No. 1709749.4, filed 19 Jun. 2017, each of which are incorporated herein by reference in their entirety.

FIELD OF THE INVENTION

The present invention relates to methods and apparatus for manufacturing a plurality of electronic circuits, and in particular, although not exclusively, for methods and apparatus suitable for mass production of high volumes of flexible electronic circuits.

BACKGROUND

A wide variety of techniques are known for manufacturing integrated circuits for incorporation in larger, overall electronic circuits, typically mounted on contact pads. Often, the techniques for manufacturing those integrated circuits (or ICs) result in the formation of an array of densely packed ICs on a common support (e.g. wafer), and then those ICs need to be separated or handled in some way from that common support (which typically provided support during the IC production process) to their final or target destination on the larger electronic circuit. The handling and transport of the ICs from the initial common support to their installation positions poses a number of problems, which are well known in the art. Particularly, in the case of thin and/or flexible ICs the provision of suitable handling is particularly challenging. For example, thin and/or flexible ICs are particularly delicate and may be damaged by inappropriate handling, leading to failure of the eventual electronic circuits in which they are incorporated.

One potential technique for transferring integrated circuits from a common support to a destination position is a planar transfer process in which a platen may be used to pick up the devices (ICs) from a common support (for example in the form of a wafer) by engaging the wafer in a plane. The ICs may be picked up and placed in their target destinations/positions individually, or a number may be picked up in parallel by a platen. Picking and placing ICs has a number of disadvantages. Firstly, if ICs are picked and placed individually, then this is a time consuming and laborious process when a large number of circuits need to be manufactured (i.e. when a large number of ICs need to be handled). It requires very accurate control and placement of the picking mechanism, both relative to the wafer carrying the ICs and the target positions on the eventual electronic circuit or circuits. Furthermore, if the ICs are particularly small, it may pose difficulties to produce a moveable platen having appropriately small dimensions so as to be able to pick and place an individual IC. Although it may be possible to use a larger platen for picking up a number of ICs in parallel, this may pose difficulties both in terms of achieving a sufficiently flat platen, and/or achieving uniform contact pressure over the plurality of ICs such that they may be picked and placed without damage or failure.

Thus, picking and placing of ICs from a wafer, or other common support, poses a number of technical challenges and problems, especially when high volumes and/or fast transfer of large numbers of ICs is required.

BRIEF SUMMARY OF THE DISCLOSURE

Accordingly, it is an object of certain embodiments of the invention to provide methods and apparatus for manufacturing a plurality of electronic circuits which overcome, at least partly, one or more of the problems associated with the prior art.

According to a first aspect of the invention there is provided a method of manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the method comprising:

providing (e.g. manufacturing) a first structure comprising the plurality of first portions;

providing (e.g. manufacturing) a second structure comprising the plurality of ICs and a common support arranged to support the plurality of ICs;

transferring said ICs from the common support onto a first roller having a removable surface portion;

transferring said ICs from the first roller onto the first structure such that each group of terminals is mounted on (brought into electrical contact with) a respective group of contact pads.

According to a second aspect of the invention there is provided a method of manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the method comprising:

providing (e.g. manufacturing) a first structure comprising the plurality of first portions;

providing (e.g. manufacturing) a second structure comprising the plurality of ICs and a common support arranged to support the plurality of ICs;

transferring said ICs from the common support onto a first roller having a removable surface portion;

transferring said ICs from the first roller onto a second roller having a removable surface portion; and transferring said ICs from the second roller onto the first structure such that each group of terminals is mounted on (brought into electrical contact with) a respective group of contact pads.

Unless otherwise stated, the following embodiments are embodiments of both the first aspect and the second aspect of the invention.

In certain embodiments said removable surface portion is a formed sheet. More specifically, the formed sheet is an elastomeric sheet, a rubber sheet or a silicone sheet.

In certain embodiments of the first aspect of the invention said removable surface portion is wrapped around a first roller cylindrical centre portion. In certain embodiments of the second aspect of the invention, separate removable surface portions are wrapped around a first roller cylindrical centre portion and a second roller cylindrical centre portion respectively.

In certain embodiments, the, or each, removable surface portion extends partially about the circumference of the respective first and, if present, the respective second roller centre portion(s). More specifically, the, or each, removable surface portion extends about approximately half of the circumference of the first and, if present, the second roller centre portion(s). In this way, for each complete X axis pass of the wafer under the first roller, the removable surface portion contacts the ICs to lift them from the preceding surface (e.g. the common support or the first roller surface).

In certain embodiments, the tension of the removable surface portion is adjustable such that the contact surface is a uniform radial distance from the roller axis.

In certain embodiments said first structure has a first surface (side) and the groups of contact pads are arranged at the first surface (side).

In certain embodiments of the first aspect, said a common support is arranged to support the plurality of ICs such that each group of terminals faces towards the common support.

In certain embodiments of the first aspect, each IC has a nominal upper side being supported on the common support, at which the respective group of terminals is provided, and a nominal lower side, such that each lower side faces away from the support and each group of terminals faces the common support.

In certain embodiments of the second aspect, said a common support is arranged to support the plurality of ICs such that each group of terminals faces away from the common support.

In certain embodiments of the second aspect, each IC has a nominal upper side, at which the respective group of terminals is provided, and a nominal lower side, the ICs being supported on the common support such that each lower side faces the support and each group of terminals faces away from the common support.

In certain embodiments each IC is substantially planar (generally flat) with the respective group of terminals being provided at one face (surface) of the IC.

In certain embodiments of the first aspect, transferring said ICs from the common support onto the first roller is arranged such that when each IC is on (supported on) the first roller the respective group of terminals faces away from the first roller (e.g. away from a surface of the first roller, i.e. faces radially outwards, away from a rotational axis of the first roller).

In certain embodiments of the second aspect, transferring said ICs from the common support onto the first roller is arranged such that when each IC is on (supported on) the first roller the respective group of terminals faces towards the first roller (e.g. faces towards a surface of the first roller, or, equivalently, faces radially inwards, towards a rotational axis of the first roller).

In certain embodiments of the second aspect, transferring said ICs from the first roller onto the second roller is arranged such that when each IC is on (supported on) the second roller the respective group of terminals faces away from the second roller (e.g. away from a surface of the second roller, i.e. faces radially outwards, away from a rotational axis of the second roller).

In certain embodiments transferring said ICs from the common support onto the first roller comprises picking (e.g. pulling, extracting, peeling, lifting, separating) said ICs from the common support with the first roller.

In certain embodiments said picking comprises engaging each IC (e.g. engaging an upper, or lower or exposed side, face, or surface of each IC) with a respective one of a plurality of IC-engaging features (structures, members, elements, protrusions, bodies) provided on the removable surface portion of the first roller.

In certain embodiments each IC-engaging feature is a feature extending radially outwards from (raised above, protruding from) the surface (e.g. substantially cylindrical surface) of the first roller. More specifically, each IC-engaging feature is formed on and extends radially outwards from the removable surface portion of the first roller.

In certain embodiments each IC-engaging feature comprises a respective IC-engaging surface, each IC-engaging surface being arranged a common radial distance from a rotational axis of the first roller.

In certain embodiments optionally the method may further comprise providing adhesive on each IC-engaging surface and/or a surface (of each IC) to be engaged by the respective IC-engaging surface.

In certain embodiments each IC-engaging surface is resilient.

In certain embodiments each IC-engaging feature is resilient.

In certain embodiments the plurality of ICs are arranged as a regular array on the common support, with a repetition interval of a distance D1 in a first direction, and the plurality of IC-engaging features are arranged as a regular array on the removable surface portion of the first roller with a repetition interval (distance, period) of n×D1 in a corresponding first direction, where n is an integer greater than or equal to 2, and the method comprises arranging the second structure at a first position relative to the first roller, picking a first group of the plurality of ICs from the common support by selectively engaging each IC (e.g. the upper side and/or the group of terminals of each IC) of that first group with said IC-engaging features, transferring said first group of ICs from the first roller onto the first structure or onto the second roller and then from the second roller onto the first structure.

In certain embodiments said corresponding first direction is one of: a direction parallel to a rotational axis of the first roller; and a circumferential distance around the first roller (i.e. at a constant radius from the rotational axis of the first roller, in a plane perpendicular to the rotational axis).

In certain embodiments the first portions are arranged as a regular array in the first structure and n×D1 corresponds to a repetition interval of the groups of contact pads in a corresponding first direction on the first structure (i.e. it corresponds to an inter-group repetition interval, not, of course, a repetition interval of contact pads within a particular group).

In certain embodiments, after transferring said first group of ICs from the first roller onto the first structure or onto the second roller and then from the second roller onto the first structure, arranging the remaining portion of the second structure at a second position relative to the first roller, picking a second group of the plurality of ICs from the common support by selectively engaging each IC (e.g. the upper side or lower side of each IC) of that second group with said IC-engaging features, transferring said second group of ICs from the first roller to the first structure or to the second roller and then from the second roller onto the first structure.

In certain embodiments, arranging the remaining portion of the second structure at a second position relative to the first roller comprises indexing the second structure in the first direction to provide an offset relative to the first position of the second structure.

In certain embodiments the regular array of ICs on the common support has a repetition interval of a distance D2 in a second direction, said second direction being perpendicular to the first direction, and the regular array of IC-engaging features on the first roller has a repetition interval of m×D2 in a corresponding second direction, where m is an integer greater than or equal to 2.

In certain embodiments said corresponding second direction is one of: a circumferential distance around the first roller (i.e. at a constant radius from the rotational axis of the first roller, in a plane perpendicular to the rotational axis); and a direction parallel to the rotation axis of the first roller.

In certain embodiments, arranging the remaining portion of the second structure at a second position relative to the first roller comprises indexing the second structure in the second direction to provide an offset relative to the first position of the second structure.

In certain embodiments the first portions are arranged as a regular array in the first structure and m×D2 corresponds to a repetition interval of the groups of contact pads in a corresponding second direction on the first structure (i.e. it corresponds to an inter-group repetition interval, not, of course, a repetition interval of contact pads within a particular group).

In certain embodiments the common support is substantially flat.

In certain embodiments the common support is rigid.

In certain embodiments the common support is flexible.

In certain embodiments transferring said ICs from the common support onto the first roller comprises: rotating the first roller about a rotational axis of the first roller; and performing a relative translation between the common support and the rotational axis of first roller (e.g. in a direction perpendicular or transverse to the rotational axis of the first roller). More specifically, the relative translation between the common support and the rotational axis of the first roller is such that the transfer of the IC from the common support onto the first roller occurs at net zero speed. In this way, accurate transfer of the IC from the common support to the first roller is assured.

In certain embodiments of the second aspect of the invention, transferring said ICs from the first roller onto the second roller comprises: rotating the first roller about a rotational axis of the first roller; and rotating the second roller about a rotational axis of the second roller, the rotational axis of the first roller being parallel to the rotation axis of the second roller.

In certain embodiments of the second aspect of the invention, said rotating of the first and second rollers comprises rotating the first roller in a first direction and rotating the second roller in an opposite direction.

In certain embodiments transferring said ICs from the first roller or the second roller onto the first structure comprises: rotating the first roller or the second roller about a rotational axis of the first roller or the second roller as applicable; and performing a relative translation between the first structure and the rotation axis of the first or the second roller as applicable (e.g. in a direction perpendicular or transverse to the rotational axis of the first roller or the second roller).

In certain embodiments transferring said ICs from first roller onto the removable surface portion of the second roller comprises picking (e.g. pulling, extracting, peeling, lifting, separating) said ICs from the first roller with the second roller.

In certain embodiments said picking comprises engaging each IC (e.g. engaging an upper, a lower or bottom side, face, or surface of each IC,) with a surface of the second roller.

In certain embodiments said surface of the second roller is the removable surface portion.

In certain embodiments of the second aspect of the invention, said picking comprises engaging each IC (e.g. engaging a lower or bottom side, face, or surface of each IC, opposite to that at which the respective group of terminals is provided) with a respective one of a plurality of IC-engaging features (structures, members, elements, protrusions, bodies) provided on the removable surface portion of the second roller.

In certain embodiments of the second aspect of the invention each IC-engaging feature on the second roller is a feature extending radially outwards from (raised above, protruding from) the removable surface portion (e.g. substantially cylindrical surface) of the second roller. More specifically, each IC-engaging feature is formed on the removable surface portion of the second roller.

In certain embodiments of the second aspect of the invention wherein each IC-engaging feature on the second roller comprises a respective IC-engaging surface, each IC-engaging surface being arranged a common radial distance from a rotational axis of the second roller.

Optionally the method may further comprise providing adhesive on the surface of the second roller or on each IC-engaging surface of the second roller, and/or a surface of each IC to be engaged by the second roller.

In certain embodiments of the second aspect of the invention each IC-engaging surface of the IC-engaging features on the second roller is resilient.

In certain embodiments of the second aspect of the invention each IC-engaging feature on the second roller is resilient.

In certain embodiments said first structure is flexible. More specifically, the first structure may be a carrier tape or web.

In certain embodiments providing said first structure on a first roll (e.g. a unwind spindle) and transferring said first structure from the first roll onto a second roll (e.g. a rewind swindle), wherein said transferring of the ICs from the first roller or the second roller onto the first structure is performed during said transferring of the first structure from the first roll onto the second roll.

In preferred embodiments the first structure is supported by a material transfer roller. More specifically, the first structure passes between the material transfer roller and the first roller, or if present, the second roller. In this way, the material transfer roller is used to transfer the ICs to the first structure by supporting the second side of the first structure, opposite the first side, as the first structure passes the first roller or the second roller (if present).

In certain embodiments, the material transfer roller comprises a rubberised surface.

In certain embodiments the material transfer roller comprises a rubberised surface extending about the entire circumference of the roller.

In certain embodiments the material transfer roller is configured for continuous rotation about its respective rotational axis. More specifically, the material transfer roller is configured for continuous rotation in a single direction about its respective rotational axis. Yet more specifically, the direction of rotation of the material transfer roller is consistent with the direction of travel of the first structure.

In certain embodiments the first structure is passed over the material transfer roller between transferring of the first structure from the first roll onto the second roll. More specifically, the first structure passes between the first roller or, the second roller (if present), and the material transfer roller as it transfers from the first roll to the second roll.

In certain embodiments when the first structure comprises a backing layer, the method further comprises providing a third roll (e.g. a backing removal spindle) and transferring the backing layer from said first structure onto the third roll before transferring the first structure between the first roll and the second roll.

In certain embodiments when a backing layer is added to the first structure after the electronic circuit(s) is/are made, the method further comprises providing a fourth roll (e.g. a backing application spindle) and transferring a backing layer to said first structure from the fourth roll after transferring the ICs onto the first structure.

In certain embodiments the method further comprises processing the first structure to separate, after mounting of the respective IC, each electronic circuit from it (e.g. by cutting or otherwise dividing up the first structure).

Apparatus arranged to implement a method in accordance with any preceding claim.

According to a third aspect of the present invention there is provided an apparatus for manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the apparatus comprising:

a first roller arranged to rotate about a first rotational axis and having a removable surface portion;

a second roller arranged to rotate about a second rotational axis and having a removable surface portion, said second rotational axis being parallel to the first rotational axis;

roller drive means (roller driving structure, assembly, system, mechanism, or at least one roller driver, for example comprising at least one drive motor) controllable to drive the rollers to rotate about their respective rotational axes);

a first support means (roller, structure, assembly, mechanism) arranged (adapted, configured) to support a first structure comprising the plurality of first portions and controllable to translate said first structure (i.e. when supported by the first support means) relative to said second rotational axis;

a second support means (structure, assembly, mechanism) arranged (adapted, configured) to support a second structure, comprising the plurality of ICs and a common support arranged to support the plurality of ICs, and controllable to translate said second structure (i.e. when supported by the second support means) relative to said first rotational axis; and control means (e.g. a control system, or at least one controller, control unit, or control module) arranged to control the roller drive means and first and second support means to transfer said ICs from the common support onto the first roller, transfer said ICs from the first roller onto the second roller, and transfer said ICs from the second roller onto the first structure such that each group of terminals is mounted on (brought into electrical contact with) a respective group of contact pads.

According to a fourth aspect of the present invention there is provided an apparatus for manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the apparatus comprising:

a first roller arranged to rotate about a first rotational axis and having a removable surface portion;

roller drive means (roller driving structure, assembly, system, mechanism, or at least one roller driver, for example comprising at least one drive motor) controllable to drive the roller to rotate about its respective rotational axis);

a first support means (roller, structure, assembly, mechanism) arranged (adapted, configured) to support a first structure comprising the plurality of first portions and controllable to translate said first structure (i.e. when supported by the first support means) relative to said first rotational axis;

a second support means (structure, assembly, mechanism) arranged (adapted, configured) to support a second structure, comprising the plurality of ICs and a common support arranged to support the plurality of ICs, and controllable to translate said second structure (i.e. when supported by the second support means) relative to said first rotational axis; and control means (e.g. a control system, or at least one controller, control unit, or control module) arranged to control the roller drive means and first and second support means to transfer said ICs from the common support onto the first roller, transfer said ICs from the first roller onto the first structure such that each group of terminals is mounted on (brought into electrical contact with) a respective group of contact pads.

Unless otherwise stated, the following embodiments are embodiments of both the third aspect and the fourth aspect of the invention.

In certain embodiments the control means is arranged to rotate the first roller to pick said ICs from the common support onto the first roller.

In certain embodiments said removable surface portion is a formed sheet. More specifically, the formed sheet is an elastomeric sheet, a rubber sheet or a silicone sheet.

In certain embodiments, the first roller comprises a cylindrical centre portion (e.g. a core).

In certain embodiments, the second roller, if present, comprises a cylindrical centre portion (e.g. a core).

In certain embodiments said removable surface portion of the first roller is wrapped around the first roller cylindrical centre portion.

In certain embodiments of the third aspect of the invention, separate removable surface portions are wrapped around the first roller cylindrical centre portion and the second roller cylindrical centre portion respectively.

In certain embodiments, the, or each, removable surface portion extends partially about the circumference of the respective first and, if present, the respective second roller centre portion(s). More specifically, the, or each, removable surface portion extends about approximately half of the circumference of the first and, if present, the second roller centre portion(s) respectively. In this way, for each complete X axis pass of the wafer under the first roller, the removable surface portion contacts the ICs to lift them from the preceding surface (e.g. the common support or the first roller surface).

In certain embodiments, the tension of the removable surface portion about its respective roller core is adjustable such that the contact surface is a uniform radial distance from the roller axis.

In certain embodiments, the surface of the cylindrical centre portion of the first roller comprises at least one aperture therein. In such embodiments the removable surface portion comprises at least one protrusion extending radially inwards from (raised above, protruding from) the innermost surface of the removable surface portion. In this way, the aperture in the cylindrical centre portion is configured to receive and retain the protrusion from the innermost surface of the removable surface portion. It is much preferred that the cylindrical centre portion has a plurality of apertures therein and that the removal surface portion has a corresponding plurality of protrusions extending radially inwards from (raised above, protruding from) the innermost surface of the removable surface portion and receivable in said corresponding apertures.

In certain embodiments of the third aspect of the invention, the surface of the cylindrical centre portion of the second roller comprises at least one aperture therein. In such embodiments the removable surface portion comprises at least one protrusion extending radially inwards from (raised above, protruding from) the innermost surface of the removable surface portion. In this way, the aperture in the cylindrical centre portion is configured to receive and retain the protrusion from the innermost surface of the removable surface portion. It is much preferred that the cylindrical centre portion has a plurality of apertures therein and that the removal surface portion has a corresponding plurality of protrusions extending radially inwards from (raised above, protruding from) the innermost surface of the removable surface portion and receivable in said corresponding apertures.

In certain embodiments the first roller comprises a plurality of IC-engaging features (structures, members, elements, protrusions, bodies) each arranged to engage and pick a respective IC from the common support onto the first roller.

In certain embodiments each IC-engaging feature is a feature extending radially outwards from (raised above, protruding from) the removable surface portion (e.g. substantially cylindrical surface) of the first roller. More specifically, each IC-engaging feature is formed on and extends radially outwards from the removable surface portion of the first roller.

In certain embodiments each IC-engaging feature comprises a respective IC-engaging surface, each IC-engaging surface being arranged a common radial distance from the rotational axis of the first roller.

In certain embodiments each IC-engaging surface is resilient.

In certain embodiments each IC-engaging feature is resilient.

In certain embodiments the second support means is adapted to support a second structure in which the plurality of ICs are arranged as a regular array on the common support, with a repetition interval of a distance D1 in a first direction, and the plurality of IC-engaging features are arranged as a regular array on the first roller with a repetition interval (distance, period) of n×D1 in a corresponding first direction, where n is an integer greater than or equal to 2, and the control means is adapted to control the roller drive means, second support means, and first support means to position the second structure at a first position relative to the first roller, pick a first group of the plurality of ICs from the common support by selectively engaging each IC (e.g. the upper side and/or the group of terminals of each IC) of that first group with said IC-engaging features, transfer said first group of ICs from the first roller onto the first structure or, in the third aspect of the invention, onto the second roller, and transfer said first group from the second roller onto the first structure.

In certain embodiments said corresponding first direction is one of: a direction parallel to a rotational axis of the first roller; and a circumferential distance around the first roller (i.e. at a constant radius from the rotational axis of the first roller, in a plane perpendicular to the rotational axis).

In certain embodiments the first portions are arranged as a regular array in the first structure and n×D1 corresponds to a repetition interval of the groups of contact pads in a corresponding first direction on the first structure (i.e. it corresponds to an inter-group repetition interval, not, of course, a repetition interval of contact pads within a particular group).

In certain embodiments, the second support means comprises a first carriage mounted on rails. More specifically, the second support means comprises a first carriage mounted on two linear rails. Slide bearings may be provided to assist in the movement of the carriage along the rails.

In certain embodiments, the second support means comprises a second carriage mounted onto the first carriage. More specifically, the second carriage is mounted on two cross-roller bearing rails mounted on the first carriage. The second carriage is moveable in a direction perpendicular to and in a parallel plane to the movement of the first carriage.

In certain embodiments the apparatus comprises a micrometer adapted to adjust the angle of the second structure and thus of the common support relative to the surface of the first roller. More specifically, the micrometer is operable to rotate the second support in a horizontal plane.

In certain embodiments the control means is adapted to control the roller drive means, second support means, and first support means, after transferring said first group of ICs from the first roller onto the first structure or, in the third aspect of the invention onto the second roller and from the second roller onto the first structure, to arrange (position) the remaining portion of the second structure at a second position relative to the first roller, pick a second group of the plurality of ICs from the common support by selectively engaging each IC (e.g. the upper side of each IC) of that second group with said IC-engaging features, transfer said second group of ICs from the first roller onto the first structure or, in the third aspect of the invention onto the second roller and transfer said second group of ICs from the second roller onto the first structure.

In certain embodiments, arranging the remaining portion of the second structure at a second position relative to the first roller comprises indexing the second structure in the first direction to provide an offset relative to the first position of the second structure. More specifically, arranging the remaining portion of the second structure at a second position relative to the first roller comprises indexing the X carriage and/or the Y carriage in the first direction to provide an offset relative to the first position of the second structure.

In certain embodiments the regular array of ICs on the common support has a repetition interval of a distance D2 in a second direction, said second direction being perpendicular to the first direction, and the regular array of IC-engaging features on the first roller has a repetition interval of m×D2 in a corresponding second direction, where m is an integer greater than or equal to 2.

In certain embodiments said corresponding second direction is one of: a circumferential distance around the first roller (i.e. at a constant radius from the rotational axis of the first roller, in a plane perpendicular to the rotational axis); and a direction parallel to the rotation axis of the first roller.

In certain embodiments, arranging the remaining portion of the second structure at a second position relative to the first roller comprises indexing the second structure in the second direction to provide an offset relative to the first position of the second structure. More specifically, arranging the remaining portion of the second structure at a second position relative to the first roller comprises indexing the X carriage and/or the Y carriage in the second direction to provide an offset relative to the first position of the second structure.

In certain embodiments the first portions are arranged as a regular array in the first structure and m×D2 corresponds to a repetition interval of the groups of contact pads in a corresponding second direction on the first structure (i.e. it corresponds to an inter-group repetition interval, not, of course, a repetition interval of contact pads within a particular group).

In certain embodiments the control means is arranged to transfer said ICs from the common support onto the first roller by rotating the first roller about the rotational axis of the first roller, and performing a relative translation between the common support and the rotation axis of first roller (e.g. in a direction perpendicular or transverse to the rotational axis of the first roller).

In certain embodiments of the third aspect of the invention, the control means is arranged to transfer said ICs from the first roller onto the second roller by rotating the first roller about the rotational axis of the first roller, and rotating the second roller about the rotational axis of the second roller.

In certain embodiments of the third aspect of the invention, the control means is arranged to transfer said ICs from the first roller onto the second roller by rotating the first roller in a first direction and rotating the second roller in an opposite direction.

In certain embodiments of the third aspect of the invention, the control means is arranged to transfer said ICs from the second roller onto the first structure by rotating the second roller about the rotational axis of the second roller, and performing a relative translation between the first structure and the rotation axis of second roller (e.g. in a direction perpendicular or transverse to the rotational axis of the second roller).

In certain embodiments of the third aspect of the invention the second roller is arranged to pick said ICs from the first roller onto the second roller.

In certain embodiments of the third aspect of the invention the removable surface portion of the second roller is arranged to engage each IC to pick each IC from the first roller.

In certain embodiments of the third aspect of the invention the second roller comprises a plurality of IC-engaging features (structures, members, elements, protrusions, bodies), each arranged to engage and pick a respective IC from the first roller.

In certain embodiments of the third aspect of the invention each IC-engaging feature of the second roller is a feature extending radially outwards from (raised above, protruding from) the removable surface (e.g. substantially cylindrical surface) of the second roller.

In certain embodiments each IC-engaging feature of the second roller comprises a respective IC-engaging surface, each IC-engaging surface being arranged a common radial distance from the rotational axis of the second roller.

In certain embodiments each IC-engaging surface of the IC-engaging features of the second roller is resilient.

In certain embodiments each IC-engaging feature of the second roller is resilient.

In certain embodiments the second roller comprises a substantially smooth IC-engaging surface. In such embodiments, there is no requirement to align the IC-engaging features of the first and second rollers with one another.

In certain embodiments of the third aspect of the invention, the second roller comprises a cylindrical centre portion (e.g. a core). The removable surface portion is preferably wrapped around and supported by at least a portion of the surface of the cylindrical centre portion.

In certain embodiments of the third aspect of the invention, the surface of the cylindrical centre portion of the second roller comprises at least one aperture therein. In such embodiments the removable surface portion comprises at least one protrusion extending radially inwards from (raised above, protruding from) the innermost surface of the removable surface portion. In this way, the aperture in the cylindrical centre portion is configured to receive and retain the protrusion from the innermost surface of the removable surface portion. It is much preferred that the cylindrical centre portion has a plurality of apertures therein and that the removal surface portion has a corresponding plurality of protrusions extending radially inwards from (raised above, protruding from) the innermost surface of the removable surface portion and receivable in said corresponding apertures.

In certain embodiments of the fourth aspect of the invention, the control means is arranged to control the roller drive means and the first and second support means to transfer said ICs from the first roller onto the first structure by rotating the first roller about the rotational axis of the first roller, and performing a relative translation between the first structure and the rotation axis of first roller (e.g. in a direction perpendicular or transverse to the rotational axis of the first roller).

In certain embodiments said first structure is flexible. More specifically, the first structure may be a carrier tape or web.

In certain embodiments the first support means comprises a material transfer roller arranged to rotate about a third rotational axis, said third rotational axis being parallel to the first and, if present, the second rotational axis.

In certain embodiments a roller drive means (roller driving structure, assembly, system, mechanism, or at least one roller driver, for example comprising at least one drive motor) is controllable to drive the material transfer roller to rotate about its respective rotational axis.

In certain embodiments the control means is adapted to control the first support structure to translate said first structure (i.e. when supported by the first support means) relative to said third rotational axis. More specifically, the control means is adapted to control the roller drive means to drive the material transfer roller to rotate about its respective rotational axis.

In certain embodiments of the third aspect of the invention, the control means is arranged to control the roller drive means and the first and second support means to transfer said ICs from the first roller onto the second by rotating the first roller about the rotational axis of the first roller, and from the second roller onto the first structure by rotating the second roller about the rotational axis of the second roller in a direction opposite to the direction of rotation of the first roller, and performing a relative translation between the first structure and the rotation axis of second roller (e.g. in a direction perpendicular or transverse to the rotational axis of the second roller).

In certain embodiments, the material transfer roller is configured to transfer the ICs to the first structure by supporting the second side of the first structure, opposite the first side, as the first structure passes the first roller or, if present, the second roller.

In certain embodiments, the material transfer roller comprises a rubberised surface.

In certain embodiments the material transfer roller comprises a rubberised surface extending about the entire circumference of the roller.

In certain embodiments the material transfer roller is configured for continuous rotation about its respective rotational axis. More specifically, the material transfer roller is configured for continuous rotation in a single direction about its respective rotational axis.

Yet more specifically, the direction of rotation of the material transfer roller is consistent with the direction of travel of the first structure.

In certain embodiments the first support means further comprises a first roll for supporting the first structure, and a second roll for supporting the first structure, the control means being adapted to control the first support structure to transfer the first structure from the first roll onto the second roll.

In certain embodiments the control means is further arranged to control the roller drive means and first and second support means to transfer the ICs from the second roller onto the first structure while (during) transferring the first structure from the first roll onto the second roll.

In certain embodiments the first structure is passed over the material transfer roller between transferring of the first structure from the first roll onto the second roll. More specifically, the first structure passes between the first roller or, if present, the second roller, and the material transfer roller as it transfers from the first roll to the second roll. In such embodiments the control means is further arranged to control the roller drive means and first and second support means to transfer the ICs from the second roller onto the first structure while (during) transferring the first structure from the first roll, over the material transfer roller and onto the second roll.

In certain embodiments when the first structure comprises a backing layer, the apparatus further comprises providing a third roll (e.g. a backing removal spindle) arranged to rotate about a fourth rotatable axis and adapted to receive the backing layer which is removed from said first structure before transferring the first structure between the first roll and the second roll.

In certain embodiments when a backing layer is added to the first structure after the electronic circuit(s) is/are made, the apparatus further comprises providing a fourth roll (e.g. a backing application spindle) arranged to rotate about a fifth rotatable axis and adapted to provide a backing layer to said first structure from the fourth roll after the ICs are transferred onto the first structure.

In embodiments of the invention, the roller drive means are controllable to drive the third and fourth roll to rotate about their respective axis. In certain embodiments, the control means are arranged to control the roller drive means to rotate the rotatable axes of the third and fourth roll.

In embodiments of the invention, the roller drive means are controllable to drive the rotational axes of the first, second, third, fourth and fifth rollers. The roller drive means may be further controllable to drive the rotational axes of the first and second roll. More specifically, the roller drive means may comprise a motor and, in certain embodiments, a shaft stepper motor operable to move the rotational axes up and down and to change the gap between adjacent rollers. In this way, the roller drive means and the controller are operable to control the height of the rollers and rolls above the second structure as well as the gap between adjacent rollers and the pressure applied to the ICs or the first structure.

In certain embodiments, the apparatus comprises a camera. More specifically, the camera is operable to locate the second structure in the first position.

In certain embodiments, the apparatus comprises a programmable CPU (e.g. a PC, laptop computer or the like).

In certain embodiments, the CPU is programmed with software to implement the IC transfer methods of the present invention, to establish operating parameters for the controller and/or with camera operating software.

In certain embodiments, the apparatus comprises an operator interface. More specifically, the operator interface is operably connected to the CPU and is operable to allow operator inputs and to provide outputs to the operator. The outputs may be visual and/or audible outputs for example.

According to an aspect of the present invention there is provided a method of manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the method comprising:

providing (e.g. manufacturing) a first structure comprising the plurality of first portions (e.g. said first structure having a first surface (side) and the groups of contact pads being arranged at the first surface (side));

providing (e.g. manufacturing) a second structure comprising the plurality of ICs and a common support arranged to support the plurality of ICs such that each group of terminals faces away from the common support (e.g. each IC having a nominal upper side, at which the respective group of terminals is provided, and a nominal lower side (which implies that the ICs are generally flat, in contrast to old fashioned chips with legs), the ICs being supported on the common support such that each lower side faces the support and each group of terminals faces away from the support);

transferring said ICs from the common support onto a first roller, such that when each IC is supported on the first roller the respective group of terminals faces towards the first roller (e.g. faces towards a surface of the first roller, or, equivalently, faces radially inwards, towards a rotational axis of the first roller;

transferring said ICs from the first roller onto a second roller, such that when each IC is supported on the second roller the respective group of terminals faces away from the second roller (e.g. away from a surface of the second roller, i.e. faces radially outwards, away from a rotational axis of the second roller); and transferring said ICs from the second roller onto the first structure such that each group of terminals is mounted on (brought into electrical contact with) a respective group of contact pads.

Another aspect provides apparatus arranged to implement such a method.

According to an aspect of the present invention there is provided a method of manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the method comprising:

providing (e.g. manufacturing) a first structure comprising the plurality of first portions (e.g. said first structure having a first surface (side) and the groups of contact pads being arranged at the first surface (side));

providing (e.g. manufacturing) a second structure comprising the plurality of ICs and a common support arranged to support the plurality of ICs such that each group of terminals faces towards the common support (e.g. each IC having a nominal upper side, at which the respective group of terminals is provided, and a nominal lower side (which implies that the ICs are generally flat, in contrast to old fashioned chips with legs), the ICs being supported on the common support such that each upper side faces the support and each group of terminals faces towards the support);

transferring said ICs from the common support onto a first roller, such that when each IC is supported on the first roller the respective group of terminals faces away from the first roller (e.g. faces away from a surface of the first roller, or, equivalently, faces radially outwards, away from a rotational axis of the first roller; and transferring said ICs from the first roller onto the first structure such that each group of terminals is mounted on (brought into electrical contact with) a respective group of contact pads.

Another aspect provides apparatus arranged to implement such a method.

BRIEF DESCRIPTION OF THE DRAWINGS

Embodiments of the present invention will now be described with reference to the accompanying drawings of which:

FIGS. 5 and 7 are perspective views of rollers suitable for use in embodiments of the invention;

FIGS. 6 and 8 are respective schematic cross sections of the rollers shown in FIGS. 5 and 7;

FIG. 11 is a schematic representation of a first structure used in certain embodiments of the invention.

DETAILED DESCRIPTION

Figure 1:
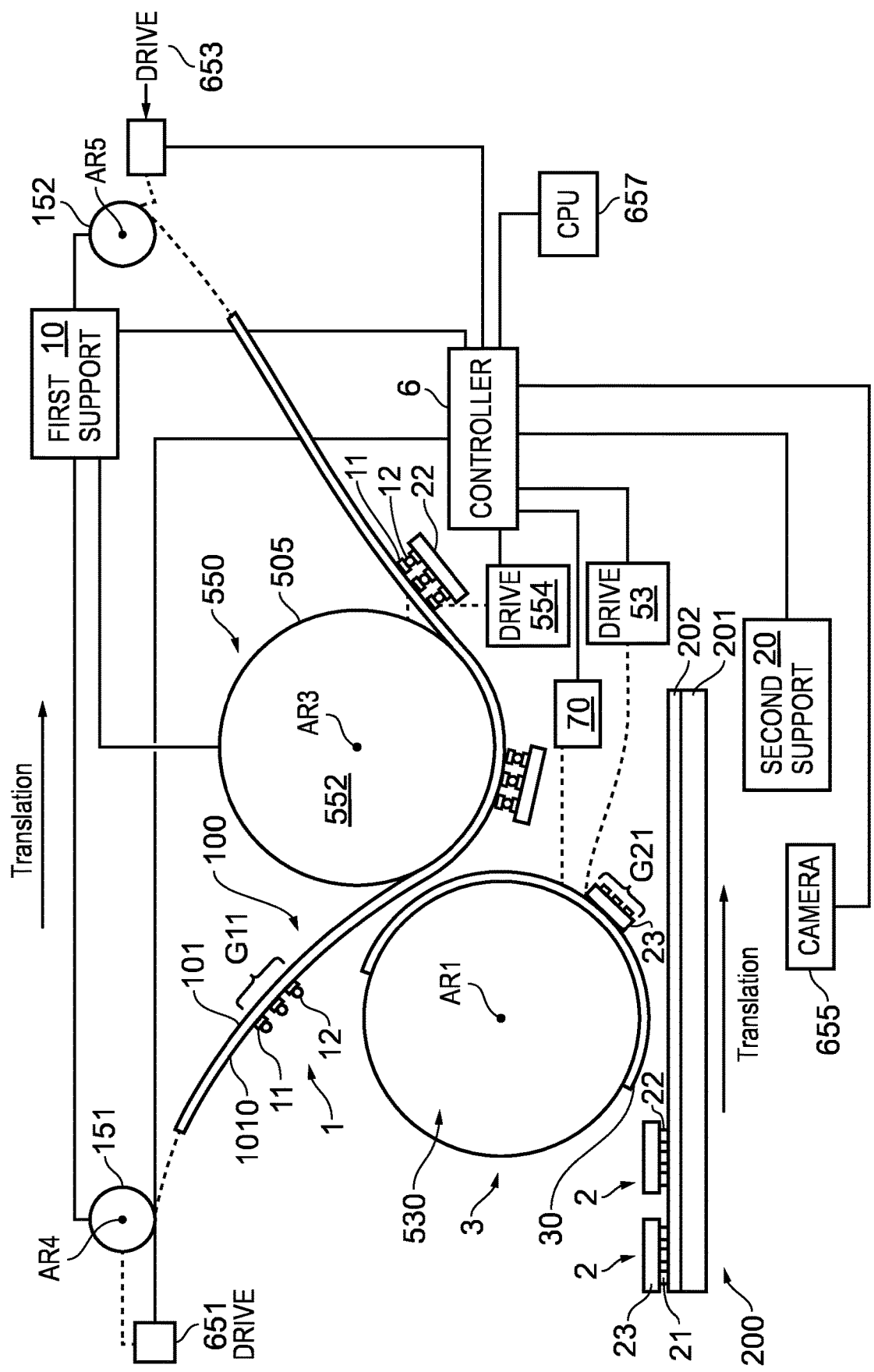
FIG. 1 is a schematic representation of apparatus embodying the invention and suitable for manufacturing a plurality of electronic circuits.

Referring now to FIG. 1 this shows a system, or apparatus, for manufacturing a plurality of electronic circuits, the system or apparatus embodying an aspect of the present invention. Each electronic circuit being manufactured comprises a respective first portion 1, which itself comprises a respective group G11 of contact pads or contacts 11, and a respective integrated circuit 2. Each integrated circuit 2 comprises a respective group G21 of terminals 21. In each electronic circuit, when manufactured, the group of terminals G21 of a particular IC are mounted on a respective group G11 of contact pads with each terminal 21 in electrical contact with respective contact pad 11. In this embodiment, a first structure 100 has been provided (i.e. it has previously been manufactured, for use in the manufacturing system) that first structure 100 comprising the plurality of first portions 1. This first structure 100 comprises a carrier tape 101 having a nominal lower surface 1010 on, or at, which the groups G11 of contact pads are provided for mounting of the ICs 2. In this particular example, the first structure 100 has initially been provided on a first roll 151 having a drive 651 controllable by a controller 6 to rotate the roll 151 about its axis of rotation AR4 and the system is adapted to transfer or convey that first structure 100 from the first roll 151, around material transfer roller 550 and onto a second roll 152 having a drive 653 controllable by a controller 6 to rotate the roll 152 about its axis of rotation AR5. The material transfer roller 550 has a central core 552 and a rubber outer layer 505 providing an outer surface of the roller 550. The roller 550 having a drive 554 controllable by a controller 6 to rotate the roller 550 about its axis of rotation AR3. The ICs 2 are mounted on, or installed, on the respective groups G11 of contact pads at an intermediate position, i.e. while the structure 100 is in contact with the outer surface 505 of roller 550 and is being transferred from the first roll 151 onto the second roll 152. The ICs 2 for mounting on the first structure 100 are themselves initially provided on a second structure 200 which comprises a common support 201, in this case a substantially flat, flexible glass or plastic sheet 201. A layer of adhesive 202 temporarily bonds the ICs 2 to the common support 201. In this example, each IC 2 is substantially planar, having terminals 21 which engage the layer 202 and is thus are supported by the common support 201. Each IC also has a nominal upper surface 23 on, or at, which the group G21 of terminals 21 is provided forming a nominal lower surface 22. Thus, the common support 201 supports each IC 2 such that its respective group of terminals 21 faces downwards, towards the common support 201.

The system further comprises a first roller 3 arranged to rotate about a first rotation axis AR1 in a first direction, this first roller having a removable silicone sheet forming outer surface 30 wrapped around a cylindrical central core 530. The removable silicone sheet covers approximately half of the outer surface of central core 530. The removable silicone sheet 30 is arranged to engage the tops of the ICs (in particular to engage the upper surfaces 23 so as to pick each IC up, from the common support 201, and onto the first roller. Thus, the first roller is arranged to lift off or peel each IC 2 from the second structure 200.

Figure 2:
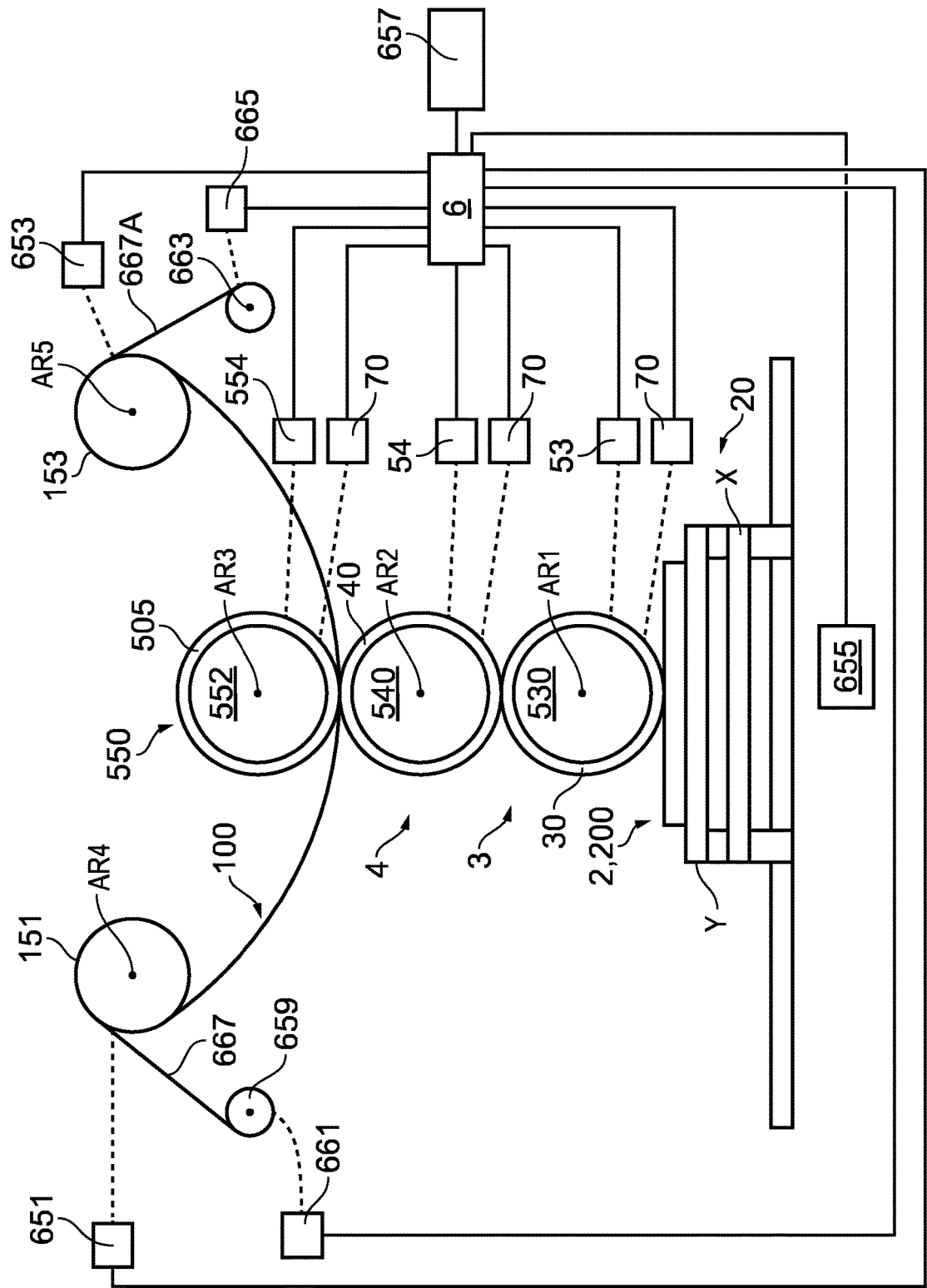
FIG. 2 is a schematic representation of a further apparatus embodying the invention and suitable for manufacturing a plurality of electronic circuits.

As seen in FIG. 2, when inversion of the ICs 2 is required before transferring same to the first structure 100, a second roller 4 having a removable silicone sheet forming outer surface 40 wrapped around a cylindrical central core 540 is provided between first roller 3 and material transfer roller 550. Second roller 4 is arranged to rotate about a second rotation axis AR2 so as to pick each IC2 from the first roller 3 and transfer each IC then onto its mounting position with respect to the first structure 100. In the embodiment depicted in FIG. 2, the removable silicone sheet 30 of roller 3 is arranged to engage the tops of the ICs (in particular to engage the groups G21 of terminals 21 so as to pick each IC up, from the common support 201, and onto the first roller. Thus, the first roller is arranged to lift off or peel each IC 2 from the second structure 200.

The system further comprises roller drive means in the form of a first drive 53 for driving the first roller 3, a second drive unit 54 for driving the second roller 4 (if present; FIG. 2) and a third drive unit 554 for driving the material transfer roller 550. The system also includes a first support, or support means or support system, 10 including first roll 151, material transfer roller 550 and second roll 152, arranged to support the first structure and also being controllable to translate the first structure relative to the second rotation axis (if present) and the third rotation axis. The system also includes a second support means 20 arranged to support the second structure and being controllable to translate the second structure relative to the first rotation axis. A camera 655, controllable by programmable CPU 657 via controller 6, is located beneath the second support 20 and is operable to assist in positioning second structure 200 relative to first roller 3. The system also includes a controller or control means 6 arranged to control the first and second support means 10, 20 and the drive means 53, 54, 554. Thus, by suitable control of the first and second support means and the roller drive means the controller is able to transfer the ICs 2 from the second structure 200 onto the first roller, then transfer the ICs 2 from the first roller onto the material transfer roller 550 (FIG. 1) or the second roller 4 (FIG. 2), and then transfer the ICs from the first roller 3 or the second roller 4 onto their installation positions on the first structure 100. In the examples shown in FIGS. 1 and 2, each IC is itself substantially flexible, and the first structure 100 with ICs mounted upon it is collected on the second roll 152 (the rotation of which, together with rotation of the first roll 151, is under control of the control means 6 in this example). To aid adhesion and mounting, each of the contact pads 11 is provided with conductive adhesive 12. Thus, the carrier tape 101 is provided with contacts 11 and patterned conductive adhesive 12.

It will be appreciated that in the example depicted in FIG. 1, the first roller 3 picks up the ICs 2 such that, when they are on the first roller, the groups G21 of terminals 21 face away from the first roller with their terminals 21 exposed for mounting on the respective contact pads 11 of the first structure 100.

It will be appreciated that in the alternative example depicted in FIG. 2, the first roller 3 picks up the ICs 2 such that, when they are on the first roller, the groups G21 of terminals 21 face the first roller. Then, when the ICs are transferred to the second roller, their groups G21 of terminals 21 face away from the second roller (i.e. away from its rotation axis, so that the ICs have been flipped in order to expose their terminals 21 for mounting on the respective contact pads 11 of the first structure 100.

In the example of FIG. 1, the removable surface 30 of the first roller 3 which engages and temporarily holds each IC during the transfer process is generally smooth. However, it will be appreciated that those contacting surfaces may take different forms in other embodiments, suitable for picking and placing the ICs. The removable contacting surface 30 may be a resilient surface, to aid the picking up and transferring processes, and in certain embodiments may be provided with adhesive material and/or adhesive coatings to assist in the picking and transfer of the ICs.

In the example of FIG. 2, the removable surfaces 30 and 40 of the first and second rollers 3, 4 respectively which engage and temporarily hold each IC during the transfer process are generally smooth. However, it will be appreciated that those contacting surfaces may take different forms in other embodiments, suitable for picking and placing the ICs. Those removable contacting surfaces 30, 40 may be resilient surfaces, to aid the picking up and transferring processes, and in certain embodiments may be provided with adhesive material and/or adhesive coatings to assist in the picking and transfer of the ICs.

Thus, the systems illustrated in FIGS. 1 and 2 can be operated to implement respective roller-transfer process. In FIG. 1, the ICs are not inverted between the second structure and the first structure whereas, in FIG. 2, the presence of the second roller 4, provides for inversion of the IC 2 between the second structure and the first structure. An advantage of such systems, incorporating roll-release of the ICs from the second structure, is a reduction in the force required to separate the devices (ICs) from the wafer or common support 201 (as compared to alternative techniques in which a vertical pull of each IC from the support is used). Although generally smooth removable roller surfaces 30, 40 are shown in the figures, alternative embodiments may incorporate rollers with raised features or cells so that only a proportion of the ICs would be picked off as they pass under the first roller. Thus, with such embodiments it is possible to pick out an array of a selected number of ICs from a large array (for example picking out 4 devices from 16, etc).

The systems of FIG. 1 and FIG. 2 also include roller position control means 70 (apparatus, unit, at least one module etc.), under control of the controller 6 and operable to provide vertical axis and/or horizontal axis control on the two or three roller positions (in other words, the position controller 70 can be used to set/adjust/vary the vertical and/or horizontal positions of the rollers' axes AR1 and/or AR2 and/or AR3) and on the first-surface support, so that the system can be run as described above (both the rollers and surfaces all move at the same time) or the individual transfers (second surface to roller 1, roller 1 to first surface or roller 1 to roller 2, and roller 2 to first surface) can be operated independently. This facilitates the process because it makes returning the second surface/wafer back to the start position much easier (it can be disengaged from the roller).

The roller position control means 70, is therefore operable to control the gap between adjacent rollers and/or the first or second roller and the first support and/or the first roller and the second support. Thus, the pressure applied to the IC 2 and/or the first structure 100 by the rollers is controllable.

As best seen in FIG. 2, the systems of the present invention may include a backing removal roller 659, operable to rotate about its axis of rotation and driven by drive roller 661 under the control of controller 6. The backing removal roller 659 is operable to receive backing layer 667 as it is removed from first structure 100. The systems of the present invention may include a backing application roller 663, operable to rotate about its axis of rotation and driven by drive roller 665 under the control of controller 6. The backing application roller 663 is operable to supply a backing layer 667A as it is applied to first structure 100.

FIGS. 1 and 2 depict programmable unit, CPU 657 which may be a laptop, PC computer or the like. The programmable unit 657 may provide inputs to and receive outputs from controller 6 and camera 655. The CPU 657 is preferably programmed with software operable to run one or more of: a system set up protocol, a camera operating protocol and an IC transfer process. The CPU is preferably linked to a user interface (not shown) at which a user can input and receive information. The user interface preferably includes an interactive graphical display screen.

Figure 3:
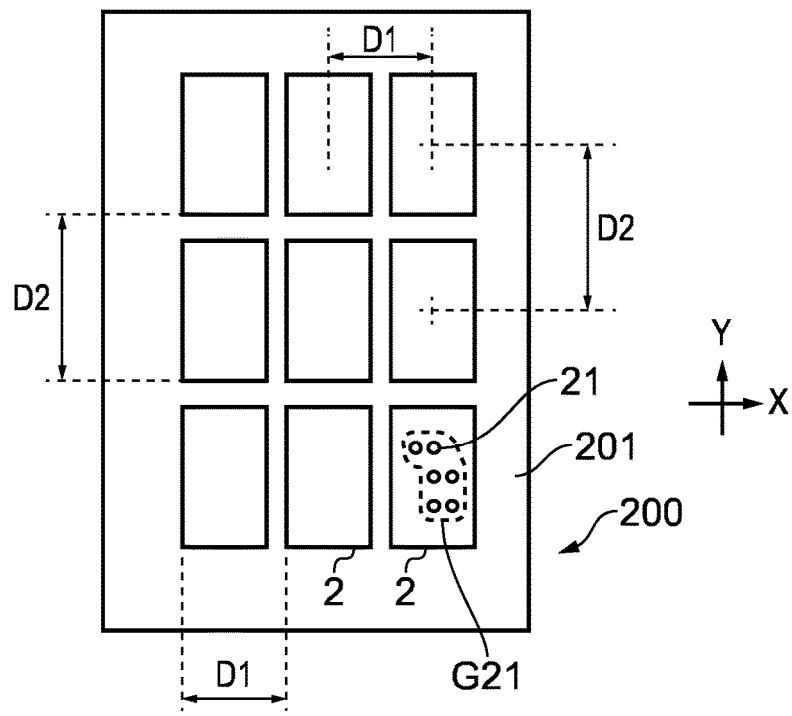
FIG. 3 is a schematic representation of a second structure used in certain embodiments of the invention and comprising an array of ICs supported by a common support.

Referring now to FIG. 3, this shows a second structure for use in embodiments of the invention. Here, the second structure 200 comprises a common support 201 arranged to support a plurality of ICs 2, those ICs being arranged in a regular rectangular array. In this example, each IC has a generally rectangular footprint, and the repetition interval or period of the ICs in a first direction (the nominal X direction) is D1. Thus, D1 corresponds to the separation of the centres of the ICs in the X direction. Similarly, the repetition interval, or centre to centre separation, of the ICs 2 in a second, perpendicular direction (the nominal Y direction) is D2. It will be appreciated that this particular arrangement of ICs is merely one example, and other forms of regular arrays of ICs may be employed in alternative embodiments. In the depicted embodiment, the terminals 21 are upstanding from the upper surface 23 of the IC 2 away from the second common support 201. In an alternative arrangement, the terminals 21 may face towards the common support 201.

Figure 4:
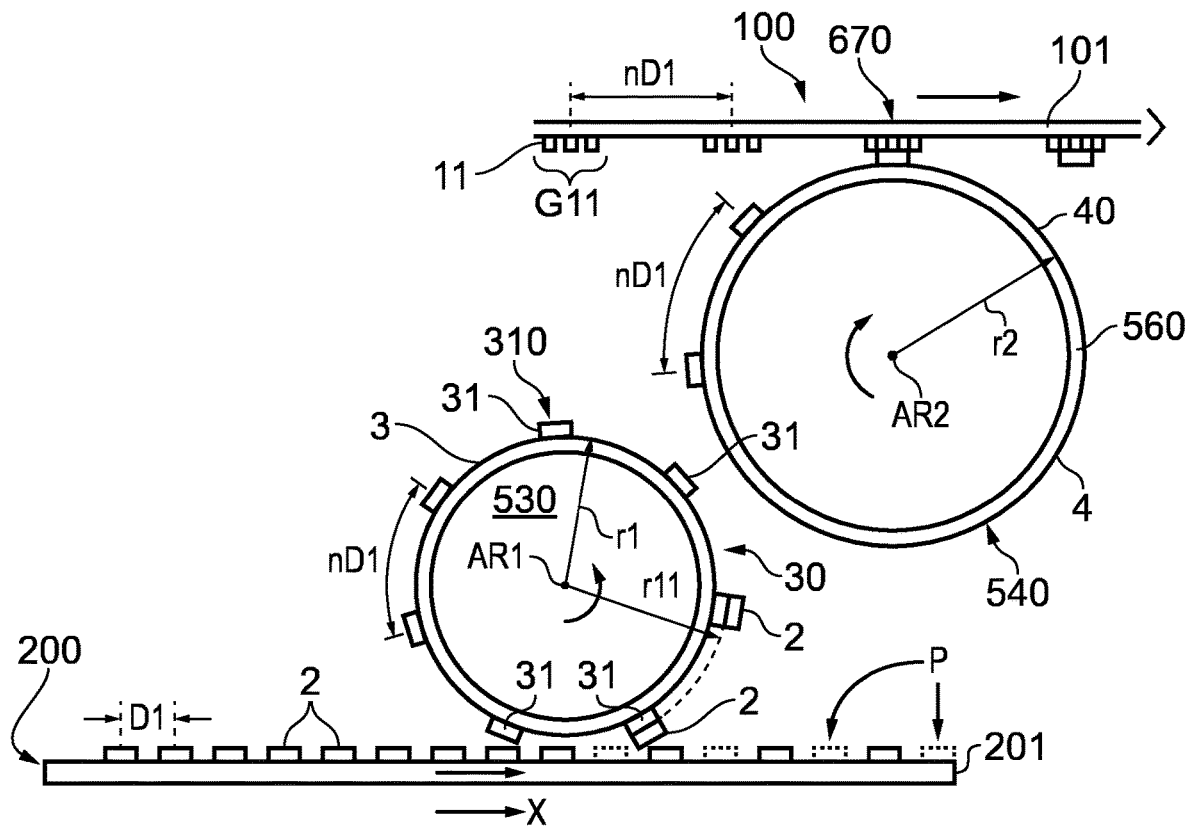
FIG. 4 is a schematic representation of part of another system embodying the invention.

Referring now to FIG. 4, this shows part of another system embodying the invention in which the ICs 2 on the second structure 200 are arranged in a regular array as separated by distance D1 in the nominal X direction. Material transfer roller 505 is not shown in the depicted embodiment although the roller 505 would be located against surface 101 of carrier tape 100 adjacent the contact point 670 between the second roller surface 40 and the contact pads 11 on tape 100. The first roller 3 is provided with a plurality of raised features or cells 31 upstanding from removable sheet 30. Each feature 31 has a respective end or IC-engaging surface 310 for picking up one of the ICs 2 from the structure 200. In this example, each end surface 310 is arranged a common radial distance R11 from the rotation axis AR1. Each feature 31 thus extends radially outwards from removable sheet surface 30 of the first roller 3, that removable sheet surface being a radial distance R1 from the rotation axis AR1. Rather than these features 31 being arranged to pick up immediately successive ICs from the structure 200, the spacing of the features 31 around the roller perimeter is such that they pick up every other IC 2. Thus, the features 31 have a repetition interval of distance n×D1 in the circumferential direction around the first roller, where n in this example is equal to 2. Thus, the spacing of the IC-engaging features 31 is twice that of the spacing of the ICs in the X direction on the support 200. After the structure 200 has been translated by the X and Y carriages (see FIG. 2) so as to pass beneath the first roller, every other IC 2 has been removed, the previous positions of the removed ICs being indicated by the arrows P in the figure. Thus, by appropriate control of the rotation of the first roller 3 and translation of the structure 200 by the X and Y carriages the system is able to pick a first portion of the ICs 2 from the structure 200 onto the first roller and carry those ICs to the second roller. In this example, the second roller 4 has a substantially cylindrical removable outer surface 40 held onto the second roller core 540 by a clamp 560. The removable outer surface 40 picks up the ICs successively from the first roller 3 (in particular, it picks or plucks them from the respective features 31 on which they are conveyed around the first rotation axis). Thus, the spacing n×D1 of the features 31 on the first roller dictates the spacing of the ICs around the circumference of the second roller 4. The first structure 100 has been provided or manufactured such that the inter-group spacing between the respective groups G11 of contact pads 11 is also equal to n×D1 (where n in this example is 2).

Although the integer n was equal to 2 in the above example, it will be appreciated that different values of n may be used in other embodiments, so as to select a particular portion or group of ICs from the second structure 200 for each pass of the structure 200 under the first roller.

In the above-described manner, the system may control the first roller and second support means to locate the structure 200 at a first position relative to the first roller and its cells or features 31. Then, a first pass may be made in which a first group of ICs 2 is picked from the structure 200 and transferred onto the first structure 100. Then, the system may appropriately reposition the second structure 200 and rollers and make a second pass so as to transfer a second group of ICs 2 onto their respective groups of contact pads 11 on the first structure 100.

As best seen in FIG. 2, the system includes an X carriage and a Y carriage, each operable to translate the structure 200 relative to the rotational axis of the first roller.

It will be appreciated that FIG. 4 shows the 2 rollers in cross section and illustrates the spacing of the features 31 in the circumferential direction around the first roller 3. The array of features 31 may also extend in an axial direction along the roller, i.e. in a direction parallel to the rotation axis AR1, as shown in FIG. 5. Thus, the separation of the features 31 in the circumferential direction may be n×D1 so as to be an integer multiple of the separation of the ICs in a corresponding first direction on the second structure 200, and the separation of those features in an axial direction, parallel to the rotation axis, may be m×D2, so as to be an integer multiple of the separation of the ICs in the second direction on the second structure 200.

Although FIG. 4 shows the second roller as having a smooth (i.e. cylindrical) removable IC engaging surface 40, it will be appreciated that in alternative embodiments the second roller may also be provided with IC engaging features 41, equivalent to those 31 of the first roller 3. Thus, in FIGS. 5-8, each illustrated roller may be used either as a first roller or a second roller in different embodiments. Each IC-engaging feature 310, 410 extends radially outwards from the removable surface 30, 40 wrapped around the respective cylinder core 530. Each feature has an IC engaging surface 310, 410 which is at a common radial distance R11 from the rotational axis AR.

FIG. 7 shows a roller in which the IC-engaging features 31, 41 are separated from each other by a distance n×D1 in a circumferential direction around the roller, which each extend in a longitudinal direction along the cylinder core 530. A roller, as shown in FIGS. 7 and 8, may thus be used in certain embodiments as a second roller to engage with and pick ICs from respective rows of IC-engaging features 31 provided on the removable sheet 30 of a first roller. Thus, in general, the IC-engaging features, if provided, on the first and second rollers may have the same or different shapes and/or sizes. The features 31 on the first roller may, in certain embodiments be relatively small so as to provide precise, accurate selection of a sub-set of the ICs 2 from the second structure 200, and the features 41 on the second roller may be relatively large to facilitate transfer of the picked ICs from the first roller onto the second roller.

Figure 10:
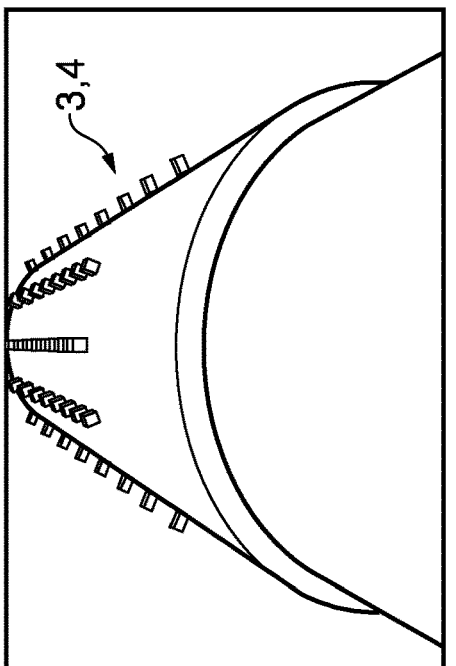
FIGS. 9 and 10 show another roller suitable for use in embodiments of the invention.
Figure 9:
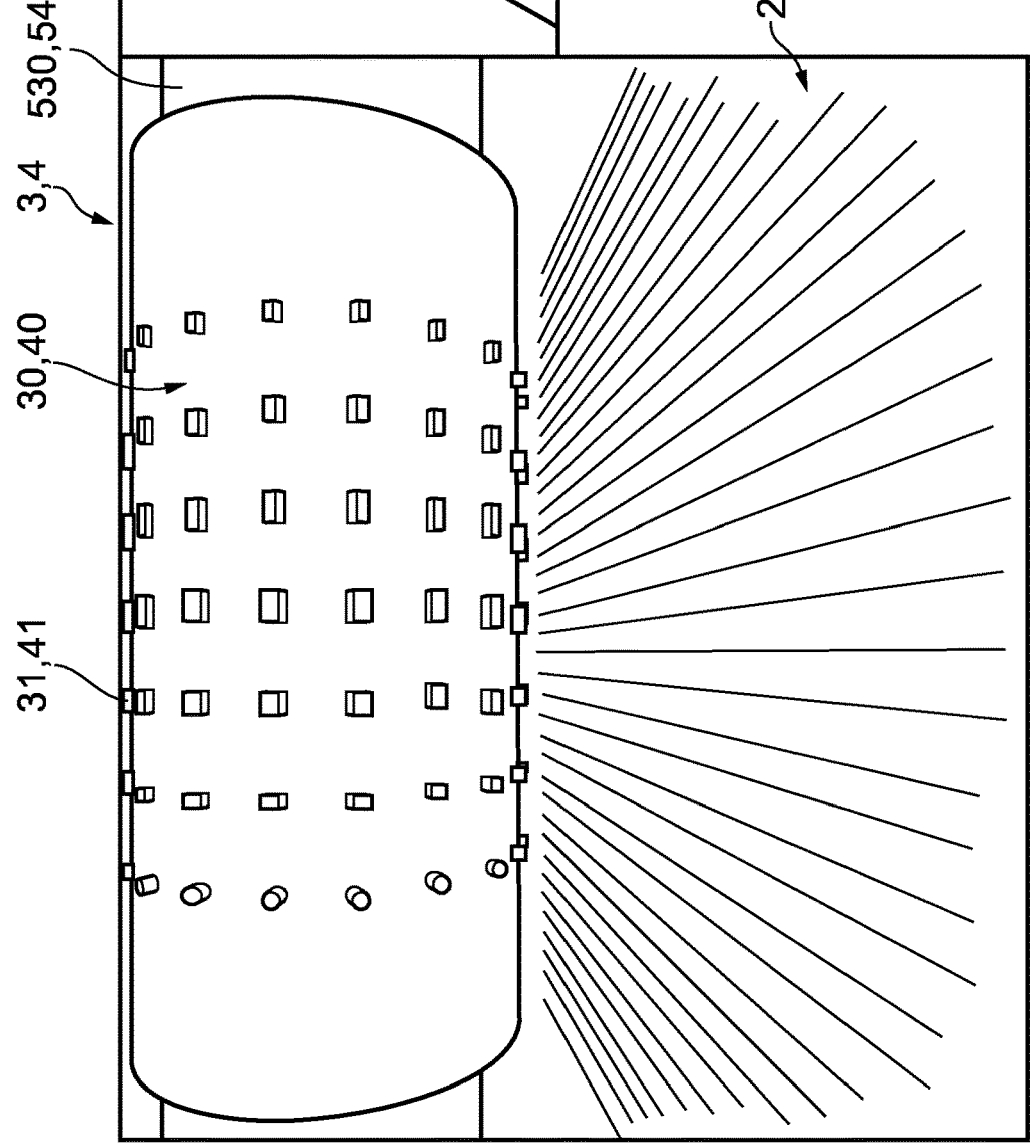

Referring now to FIG. 9 and FIG. 10, these show another roller suitable for use in embodiments of the invention. Here the roller comprises a cylindrical body or centre portion 530, 540 on which the removable outer resilient and generally cylindrical body of material 30, 40 has been provided. In this example, the resilient body of material is a silicone elastomer sheet. The resilient sheet 30, 40 is provided with an array of resilient features or cells 31, 41, each of which extends from a nominal base surface of the cylindrical member out to a respective IC-engaging surface 30, 40. The array of features 31, 41 in this example includes features of differing sizes and shapes, although the same radial extent from the rotation axis of the cylinder. The roller is shown in FIG. 9 positioned over a base plate which forms part of the second support means 20 for supporting a second structure 200 carrying ICs and translating that structure past the roller such that the features 31, 41 may engage with and pick off a selected group of the ICs.

It will be appreciated that benefits of a transfer process as described above with reference to embodiments of the invention, compared to a pick and place process, include:

a proportion of the densely packed flexible ICs in certain embodiments can be removed from the second structure (e.g. the wafer) and placed into a roller of flexible printed circuits all in one step. An index of the wafer position and an index of the roll can be swiftly carried out ready for the next transfer. This approach lends itself to populating a roll of flexible circuits very rapidly with ICs.

Because multiple devices may be transferred at once, they can remain well aligned to one another and to the first structure (e.g. the circuit roll). In comparison, with a pick and place scenario every IC has to be picked up individually and aligned precisely to the circuit it is being placed into. This requires expensive, precise, and fast alignment systems (including high grade software, cameras, and actuators). Thus, embodiments of the present invention can provide a less expensive, but equally precise, and faster alignment technique, suitable for mass production techniques.

In certain embodiments, flexible ICs are fabricated on thin plastic films, which are temporarily bonded to a rigid (e.g. glass) carrier. In certain embodiments the thickness of the plastic film may be 25 μm, or even 5-10 μm. At these thicknesses, the ICs are very fragile. With a pick and place approach the device must not only be picked up but "flipped" because it is initially picked up from the top (contacts) side, yet has to be placed from the back so that the contacts are down (or at least towards the receiving circuit). A transfer mechanism, such as the dual roll system described above, avoids this additional handling, and also the problem of having to use successive vacuum suckers to get hold of the ICs which may be extremely delicate objects.

Another advantage of embodiments of the invention is that it can make alignment easier. The system can be according to a rigid design, and may be set up to have only one major motion axis. Certain embodiments of the invention resemble a printing process, and are compatible with continuous "sheet to roll" methods of production.

It will be appreciated that details of IC-engaging surfaces, and whether or not to apply suitable adhesives to assist in the picking and placing of ICs may be implemented differently in various embodiments so as to suit particular application details, as would be apparent to the person skilled in this field. In other words, the skilled person will be aware of techniques and details for providing appropriate adhesion between the ICs, rollers, and first and second structures.

It will be appreciated that embodiments of the invention are able to provide well-aligned transfer of ICs onto a first structure using, in certain examples, at least one castellated roller.

It will be appreciated that certain embodiments provide a dual-cylinder IC transfer system able to pick and transfer flexible ICs from an initial second structure to a carrier tape carrying arrays of contact pads. The system may include suitable control means and actuators (e.g. positioning systems or units) to achieve the necessary alignment. The alignment system may incorporate optical means for achieving the desired alignment.

In certain embodiments, the ICs may be plastic film-based ICs, initially provided in a flat array of such devices on a glass carrier plate. Embodiments of the invention are able to transfer such devices onto a carrier tape of corresponding contact pads. This transport utilises first and second rollers, the second roller being present in order to invert the devices so that the IC device contacts are exposed ready to contact the conductive adhesive that may have previously been applied to the carrier tape contact pads. The second structure in certain embodiments may also be described as a wafer, comprising a glass carrier, and plurality of flexible ICs mounted thereon with UV-releasable adhesive for example. The actual wafer may be circular, but the array of devices on it will, in general, be rectangular. The first structure may also be described as a receiving foil in certain embodiments, incorporating, for example, fan-out contacts.

In certain embodiments, after transferring the ICs to the first structure, the resulting structure may then be processed so as to separate the first circuits or first circuit portions.

It will be appreciated that in certain embodiments of the invention the second roller, if present, may or may not, have raised features in the same array as the first roller, or in a different array, and those raised features may be of the same or a different size and/or adhesion to facilitate picking off the ICs from the first roller and placing on the first structure.

It will be appreciated that by providing the first and second rollers with removable surfaces, the pitch between IC-engaging features can be readily changed by providing additional surfaces wherein the IC-engaging features are differently spaced (i.e. n greater than 2 and/or m greater than 2).

Referring now to FIG. 11, this shows a first structure used in certain embodiments of the invention. In this example, the first structure is flexible and may be carried on a roller and transferred from one roller to another. FIG. 11 shows just one side of the structure 100, on which a plurality of ICs 2 are to be placed. The illustrated portion of the structure 100 shows a rectangular array of 4 first portions 1a, 1b, 1c, 1d, with the broken lines across and along the structure 100 illustrating the nominal positions of the first portions and hence how this structure 100 will eventually be cut up or otherwise divided to separate the final electronic circuits from each other. Each first portion comprises a respective group of contact pads 11 and a corresponding plurality of electrical tracks, wires, traces, or other such electrically conductive entities 13 connecting the array of contact pads 11 to a further sub-portion 14 of the electronic circuit portion 1. Thus, the portions 14a-14d may, for example, comprise one or more further circuit components. The nominal positions at which the respective ICs are to be mounted on the groups of contact pads 11 are labelled 2a-2d in the figure. Thus, in certain embodiments after each IC has been mounted in its respective position on the first circuit portion 1, the resultant structure comprises a functioning electronic circuit. In other embodiments, further processing, for example incorporating connection of the first portion and IC to other electrical entities, may be required to complete the relevant circuits.

Figure 12:
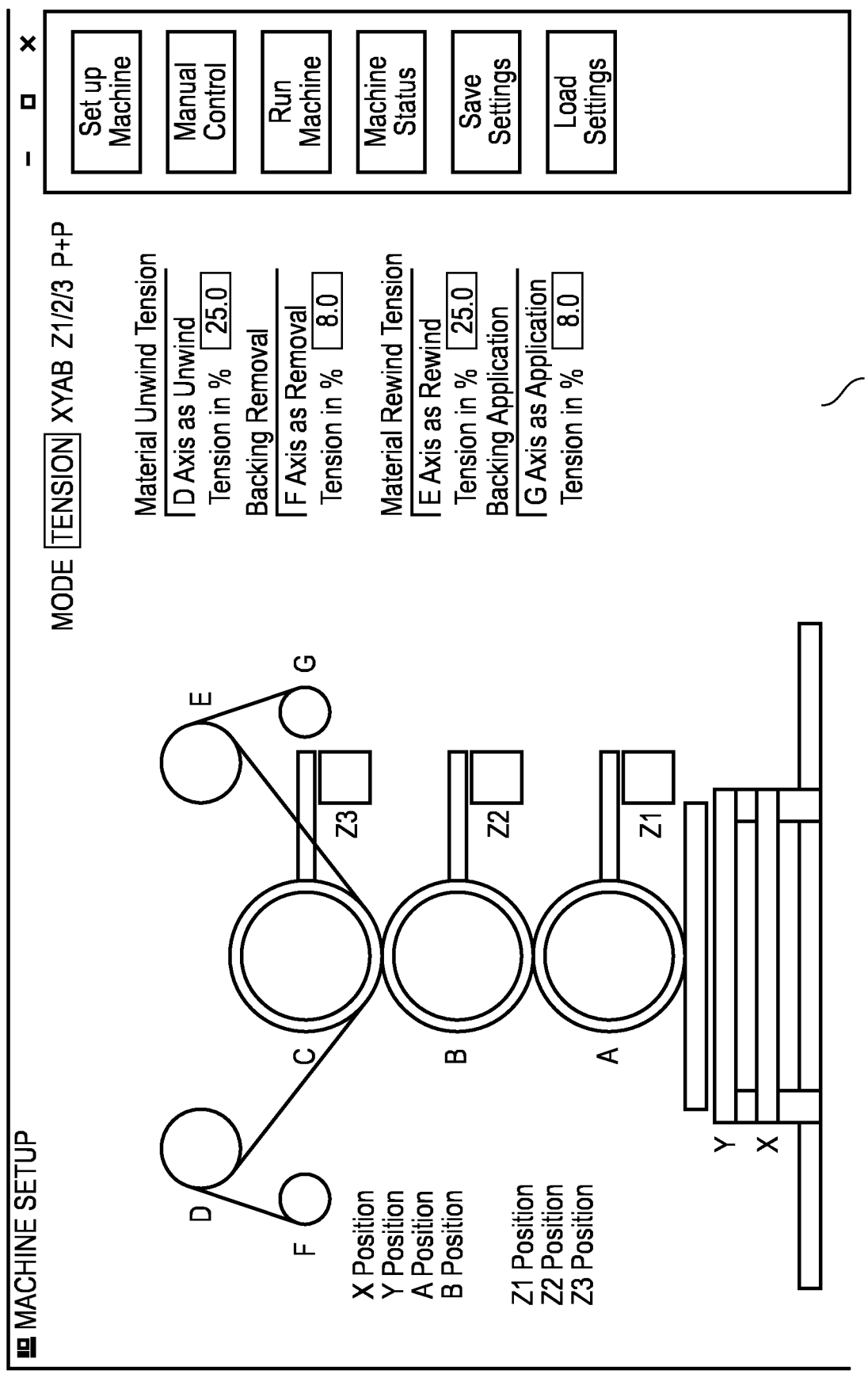
FIG. 12 is a schematic representation of a graphical display on an operator interface of a system embodying the invention.

FIG. 12 shows an exemplary graphical display 700 showing a system according to the invention as presented to a user on the operator interface of CPU 657. The representation shows roller positions A, B and C for the first roller 3, the second roller 4 and the material transfer roller 550 respectively. Positions D and E depict the first roll 151 and the second roll 152 respectively. The backing removal and application rollers 659, 663 are shown by positions F and G respectively. Roller position controllers 70 for rollers 3, 4 and 550 are shown at Z1, Z2 and Z3 respectively. The X and Y carriages supporting the common support 200 are also clearly shown. The right hand side of the interactive display shows the parameter area of the display. There are five tabs that may be used to switch between five different sets of parameters: 1) Mode—is used to select the overall function of the machine and the function of each axis; 2) Tension—is used to set up the tension of the carrier web 100 for the unwind and rewind rolls 151, 152 and the backing removal and backing application rollers 659, 663; 3) XYAB—is used to set up the main process positions of the X, Y, A and B axes; 4) Z1/2/3—is used to set up the process position of the Z1, Z2 and Z3 axes; 5) P+P—is used to set up the process parameters when the system is used in the pick and place mode of operation. When the user selects the appropriate mode on the display 700, the CPU 657 operates to control the system via controller 6.

When no inversion of the IC is required, the material transfer roller 550 is mounted onto the B axis of the system and the C axis is unused. When inversion of the IC is required, the material transfer roller 550 is mounted onto the C axis and the second roller 4 is mounted onto the B axis.

Throughout the description and claims of this specification, the words "comprise" and "contain" and variations of them mean "including but not limited to", and they are not intended to (and do not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

It should also be noted that the present disclosure can also take configurations in accordance with the following numbered clauses:

1. A method of manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the method comprising:

providing (e.g. manufacturing) a first structure comprising the plurality of first portions;

providing (e.g. manufacturing) a second structure comprising the plurality of ICs and a common support arranged to support the plurality of ICs;

transferring said ICs from the common support onto a first roller having a removable surface portion;

transferring said ICs from the first roller onto the first structure such that each group of terminals is mounted on (brought into electrical contact with) a respective group of contact pads.

2. A method of manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the method comprising:

providing (e.g. manufacturing) a first structure comprising the plurality of first portions;

providing (e.g. manufacturing) a second structure comprising the plurality of ICs and a common support arranged to support the plurality of ICs;

transferring said ICs from the common support onto a first roller having a removable surface portion;

transferring said ICs from the first roller onto a second roller having a removable surface portion; and transferring said ICs from the second roller onto the first structure such that each group of terminals is mounted on (brought into electrical contact with) a respective group of contact pads.

3. A method according to clause 1 or clause 2, wherein said removable surface portion is a formed sheet.

4. A method according to clause 3, wherein said formed sheet is an elastomeric sheet, a rubber sheet or a silicone sheet.

5. A method according to any preceding clause, wherein said removable surface portion is wrapped around a first roller cylindrical centre portion.

6. A method according to any one of clauses 2 to 5, wherein separate removable surface portions are wrapped around a first roller cylindrical centre portion and a second roller cylindrical centre portion respectively.

7. A method according to any preceding clause, wherein the, or each, removable surface portion extends partially about the circumference of the respective first and, if present, the respective second roller centre portion(s).

8. A method according to clause 7, wherein, the, or each, removable surface portion extends about approximately half of the circumference of the first and, if present, the second roller centre portion(s).

9. A method according to any preceding clause, wherein the tension of the, or each, removable surface portion is adjustable such that the contact surface is a uniform radial distance from the roller axis.

10. A method according to any preceding clause when dependent upon clause 1, wherein transferring said ICs from the common support onto the first roller is arranged such that when each IC is on (supported on) the first roller the respective group of terminals faces away from the first roller (e.g. away from a surface of the first roller, i.e. faces radially outwards, away from a rotational axis of the first roller).

11. A method according to any preceding clause when dependent upon clause 2, wherein transferring said ICs from the common support onto the first roller is arranged such that when each IC is on (supported on) the first roller the respective group of terminals faces towards the first roller (e.g. faces towards a surface of the first roller, or, equivalently, faces radially inwards, towards a rotational axis of the first roller).

12. A method according to any preceding clause when dependent upon clause 2, wherein transferring said ICs from the first roller onto the second roller is arranged such that when each IC is on (supported on) the second roller the respective group of terminals faces away from the second roller (e.g. away from a surface of the second roller, i.e. faces radially outwards, away from a rotational axis of the second roller).

13. A method according to any preceding clause, wherein transferring said ICs from the common support onto the first roller comprises picking (e.g. pulling, extracting, peeling, lifting, separating) said ICs from the common support with the first roller.

14. A method according to clause 13, wherein said picking comprises engaging each IC (e.g. engaging an upper, or lower or exposed side, face, or surface of each IC) with a respective one of a plurality of IC-engaging features (structures, members, elements, protrusions, bodies) provided on the removable surface portion of the first roller.

15. A method according to clause 13 or clause 14, wherein each IC-engaging feature is a feature extending radially outwards from (raised above, protruding from) the surface (e.g. substantially cylindrical surface) of the first roller.

16. A method according to any one of clauses 13 to 15, wherein each IC-engaging feature comprises a respective IC-engaging surface, each IC-engaging surface being arranged a common radial distance from a rotational axis of the first roller.

17. A method according to any one of clauses 13 to 16, wherein the plurality of ICs are arranged as a regular array on the common support, with a repetition interval of a distance D1 in a first direction, and the plurality of IC-engaging features are arranged as a regular array on the removable surface portion of the first roller with a repetition interval (distance, period) of n×D1 in a corresponding first direction, where n is an integer greater than or equal to 2, and the method comprises arranging the second structure at a first position relative to the first roller, picking a first group of the plurality of ICs from the common support by selectively engaging each IC (e.g. the upper side and/or the group of terminals of each IC) of that first group with said IC-engaging features, transferring said first group of ICs from the first roller onto the first structure or onto the second roller and then from the second roller onto the first structure.

18. A method according to clause 17, wherein said corresponding first direction is one of: a direction parallel to a rotational axis of the first roller; and a circumferential distance around the first roller (i.e. at a constant radius from the rotational axis of the first roller, in a plane perpendicular to the rotational axis).

19. A method according to any preceding clause, wherein the first portions are arranged as a regular array in the first structure and n×D1 corresponds to a repetition interval of the groups of contact pads in a corresponding first direction on the first structure (i.e. it corresponds to an inter-group repetition interval, not, of course, a repetition interval of contact pads within a particular group).

20. A method according to any preceding clause, wherein after transferring said first group of ICs from the first roller onto the first structure or onto the second roller and then from the second roller onto the first structure, arranging the remaining portion of the second structure at a second position relative to the first roller, picking a second group of the plurality of ICs from the common support by selectively engaging each IC (e.g. the upper side or lower side of each IC) of that second group with said IC-engaging features, transferring said second group of ICs from the first roller to the first structure or to the second roller and then from the second roller onto the first structure.

21. A method according to clause 20, wherein arranging the remaining portion of the second structure at a second position relative to the first roller comprises indexing the second structure in the first direction to provide an offset relative to the first position of the second structure.

22. A method according to any one of clauses 17 to 21, wherein the regular array of ICs on the common support has a repetition interval of a distance D2 in a second direction, said second direction being perpendicular to the first direction, and the regular array of IC-engaging features on the first roller has a repetition interval of m×D2 in a corresponding second direction, where m is an integer greater than or equal to 2.

23. A method according to clause 22, wherein said corresponding second direction is one of: a circumferential distance around the first roller (i.e. at a constant radius from the rotational axis of the first roller, in a plane perpendicular to the rotational axis); and a direction parallel to the rotation axis of the first roller.

24. A method according to any preceding clause, wherein the first portions are arranged as a regular array in the first structure and m×D2 corresponds to a repetition interval of the groups of contact pads in a corresponding second direction on the first structure.

25. A method according to any preceding clause, wherein transferring said ICs from the common support onto the first roller comprises: rotating the first roller about a rotational axis of the first roller; and performing a relative translation between the common support and the rotational axis of first roller (e.g. in a direction perpendicular or transverse to the rotational axis of the first roller).

26. A method according to clause 25, wherein the relative translation between the common support and the rotational axis of the first roller is such that the transfer of the IC from the common support onto the first roller occurs at net zero speed.

27. A method according to any preceding clause when dependent upon clause 2, wherein transferring said ICs from the first roller onto the second roller comprises: rotating the first roller about a rotational axis of the first roller; and rotating the second roller about a rotational axis of the second roller, the rotational axis of the first roller being parallel to the rotation axis of the second roller.

28. A method according to clause 27, wherein said rotating of the first and second rollers comprises rotating the first roller in a first direction and rotating the second roller in an opposite direction.

29. A method according to any preceding clause, wherein transferring said ICs from the first roller or the second roller onto the first structure comprises: rotating the first roller or the second roller about a rotational axis of the first roller or the second roller as applicable; and performing a relative translation between the first structure and the rotation axis of the first or the second roller as applicable (e.g. in a direction perpendicular or transverse to the rotational axis of the first roller or the second roller).

30. A method according to any preceding clause when dependent upon clause 2, wherein transferring said ICs from first roller onto the removable surface portion of the second roller comprises picking (e.g. pulling, extracting, peeling, lifting, separating) said ICs from the first roller with the second roller.

31. A method according to clause 30, wherein said picking comprises engaging each IC (e.g. engaging an upper, a lower or bottom side, face, or surface of each IC,) with a surface of the second roller.

32. A method according to clause 31, wherein said surface of the second roller is the removable surface portion.

33. A method according to any preceding clause when dependent upon clause 2, wherein said picking comprises engaging each IC (e.g. engaging a lower or bottom side, face, or surface of each IC, opposite to that at which the respective group of terminals is provided) with a respective one of a plurality of IC-engaging features (structures, members, elements, protrusions, bodies) provided on the removable surface portion of the second roller.

34. A method according to clause 33, wherein each IC-engaging feature on the second roller is a feature extending radially outwards from (raised above, protruding from) the removable surface portion (e.g. substantially cylindrical surface) of the second roller.

35. A method according to clause 34, wherein each IC-engaging feature is formed on the removable surface portion of the second roller.

36. A method according to any one of clauses 33 to 35, wherein each IC-engaging feature on the second roller comprises a respective IC-engaging surface, each IC-engaging surface being arranged a common radial distance from a rotational axis of the second roller.

37. A method according to clause 36, wherein each IC-engaging surface of the IC-engaging features on the second roller is resilient.

38. A method according to any one of clauses 33 to 37, wherein each IC-engaging feature on the second roller is resilient.

39. A method according to any preceding clause, wherein said first structure is flexible.

40. A method according to any preceding clause, comprising providing said first structure on a first roll (e.g. a unwind spindle) and transferring said first structure from the first roll onto a second roll (e.g. a rewind swindle), wherein said transferring of the ICs from the first roller or the second roller onto the first structure is performed during said transferring of the first structure from the first roll onto the second roll.

41. A method according to any preceding clause, wherein the first structure is supported by a material transfer roller.

42. A method according to clause 41, wherein the first structure passes between the material transfer roller and the first roller, or if present, the second roller.

43. A method according to clause 41 or clause 42, wherein the material transfer roller comprises a rubberised surface.

44. A method according to any one of clauses 41 to 43, wherein the material transfer roller comprises a rubberised surface extending about the entire circumference of the roller.

45. A method according to any one of clauses 41 to 44, wherein the first structure is passed over the material transfer roller between transferring of the first structure from the first roll onto the second roll.

46. A method according to any preceding clause, wherein when the first structure comprises a backing layer, the method further comprises providing a third roll (e.g. a backing removal spindle) and transferring the backing layer from said first structure onto the third roll before transferring the first structure between the first roll and the second roll.

47. A method according to any preceding clause, wherein when a backing layer is added to the first structure after the electronic circuit(s) is/are made, the method further comprises providing a fourth roll (e.g. a backing application spindle) and transferring a backing layer to said first structure from the fourth roll after transferring the ICs onto the first structure.

48. Apparatus arranged to implement a method in accordance with any preceding clause.

49. An apparatus for manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the apparatus comprising:

a first roller arranged to rotate about a first rotational axis and having a removable surface portion;

a second roller arranged to rotate about a second rotational axis and having a removable surface portion, said second rotational axis being parallel to the first rotational axis;

roller drive means (roller driving structure, assembly, system, mechanism, or at least one roller driver, for example comprising at least one drive motor) controllable to drive the rollers to rotate about their respective rotational axes);

a first support means (roller, structure, assembly, mechanism) arranged (adapted, configured) to support a first structure comprising the plurality of first portions and controllable to translate said first structure (i.e. when supported by the first support means) relative to said second rotational axis;

a second support means (structure, assembly, mechanism) arranged (adapted, configured) to support a second structure, comprising the plurality of ICs and a common support arranged to support the plurality of ICs, and controllable to translate said second structure (i.e. when supported by the second support means) relative to said first rotational axis; and control means (e.g. a control system, or at least one controller, control unit, or control module) arranged to control the roller drive means and first and second support means to transfer said ICs from the common support onto the first roller, transfer said ICs from the first roller onto the second roller, and transfer said ICs from the second roller onto the first structure such that each group of terminals is mounted on (brought into electrical contact with) a respective group of contact pads.

50. An apparatus for manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the apparatus comprising:

a first roller arranged to rotate about a first rotational axis and having a removable surface portion;

roller drive means (roller driving structure, assembly, system, mechanism, or at least one roller driver, for example comprising at least one drive motor) controllable to drive the roller to rotate about its respective rotational axis);

a first support means (roller, structure, assembly, mechanism) arranged (adapted, configured) to support a first structure comprising the plurality of first portions and controllable to translate said first structure (i.e. when supported by the first support means) relative to said first rotational axis;

a second support means (structure, assembly, mechanism) arranged (adapted, configured) to support a second structure, comprising the plurality of ICs and a common support arranged to support the plurality of ICs, and controllable to translate said second structure (i.e. when supported by the second support means) relative to said first rotational axis; and control means (e.g. a control system, or at least one controller, control unit, or control module) arranged to control the roller drive means and first and second support means to transfer said ICs from the common support onto the first roller, transfer said ICs from the first roller onto the first structure such that each group of terminals is mounted on (brought into electrical contact with) a respective group of contact pads.

51. An apparatus according to clause 49 or clause 50, wherein the control means is arranged to rotate the first roller to pick said ICs from the common support onto the first roller.

52. An apparatus according to any one of clauses 49 to 51, wherein said, or each, removable surface portion is a formed sheet.

53. An apparatus according to clause 52, wherein the, or each, formed sheet is an elastomeric sheet, a rubber sheet or a silicone sheet.

54. An apparatus according to any one of clauses 49 to 53, wherein the first roller comprises a cylindrical centre portion (e.g. a core).

55. An apparatus according to any one of clauses 49 to 54, when dependent upon clause 49, wherein the second roller comprises a cylindrical centre portion (e.g. a core).

56. An apparatus according to any one of clauses 49 to 55, wherein said removable surface portion of the first roller is wrapped around the first roller cylindrical centre portion.

57. An apparatus according to any one of clauses 49 to 56, wherein separate removable surface portions are wrapped around the first roller cylindrical centre portion and the second roller cylindrical centre portion respectively.

58. An apparatus according to any one of clauses 49 to 57 wherein the, or each, removable surface portion extends partially about the circumference of the respective first and, if present, the respective second roller centre portion(s).

59. An apparatus according to clause 58, wherein the, or each, removable surface portion extends about approximately half of the circumference of the first and, if present, the second roller centre portion(s) respectively.

60. An apparatus according to any one of clauses 49 to 59, wherein the tension of the removable surface portion about its respective roller core is adjustable such that the contact surface is a uniform radial distance from the roller axis.

61. An apparatus according to any one of clauses 49 to 60, wherein the surface of the cylindrical centre portion of the first roller comprises at least one aperture therein.

62. An apparatus according to clause 61, wherein the removable surface portion comprises at least one protrusion extending radially inwards from (raised above, protruding from) the innermost surface of the removable surface portion.

63. An apparatus according to any one of clauses 49 to 62, when dependent upon clause 49, wherein the surface of the cylindrical centre portion of the second roller comprises at least one aperture therein.

64. An apparatus according to clause 63, wherein the removable surface portion comprises at least one protrusion extending radially inwards from (raised above, protruding from) the innermost surface of the removable surface portion.

65. An apparatus according to any one of clauses 49 to 64, wherein the first roller comprises a plurality of IC-engaging features (structures, members, elements, protrusions, bodies) each arranged to engage and pick a respective IC from the common support onto the first roller.

66. An apparatus according to clause 65, wherein each IC-engaging feature is a feature extending radially outwards from (raised above, protruding from) the removable surface portion (e.g. substantially cylindrical surface) of the first roller.

67. An apparatus according to clause 65 or clause 66, wherein each IC-engaging feature comprises a respective IC-engaging surface, each IC-engaging surface being arranged a common radial distance from the rotational axis of the first roller.

68. An apparatus according to clause 67, wherein each IC-engaging surface is resilient.

69. An apparatus according to any one of clauses 65 to 68, wherein each IC-engaging feature is resilient.

70. An apparatus according to any one of clauses 65 to 69, wherein the second support means is adapted to support a second structure in which the plurality of ICs are arranged as a regular array on the common support, with a repetition interval of a distance D1 in a first direction, and the plurality of IC-engaging features are arranged as a regular array on the first roller with a repetition interval (distance, period) of n×D1 in a corresponding first direction, where n is an integer greater than or equal to 2, and the control means is adapted to control the roller drive means, second support means, and first support means to position the second structure at a first position relative to the first roller, pick a first group of the plurality of ICs from the common support by selectively engaging each IC (e.g. the upper side and/or the group of terminals of each IC) of that first group with said IC-engaging features, transfer said first group of ICs from the first roller onto the first structure or onto the second roller, and transfer said first group from the second roller onto the first structure.

71. An apparatus according clause 70, wherein said corresponding first direction is one of: a direction parallel to a rotational axis of the first roller; and a circumferential distance around the first roller (i.e. at a constant radius from the rotational axis of the first roller, in a plane perpendicular to the rotational axis).

72. An apparatus according to any one of clauses 49 to 71, wherein the first portions are arranged as a regular array in the first structure and n×D1 corresponds to a repetition interval of the groups of contact pads in a corresponding first direction on the first structure.

73. An apparatus according to any one of clauses 49 to 72, wherein the second support means comprises a first carriage mounted on rails.

74. An apparatus according to clause 73, wherein a second carriage is mounted onto the first carriage.

75. An apparatus according to clause 74, wherein the second carriage is moveable in a direction perpendicular to and in a parallel plane to the movement of the first carriage.

76. An apparatus according to any one of clauses 49 to 75, comprising a micrometer adapted to adjust the angle of the second structure and thus of the common support relative to the surface of the first roller.

77. An apparatus according to any one of clauses 65 to 76, wherein the control means is adapted to control the roller drive means, second support means, and first support means, after transferring said first group of ICs from the first roller onto the first structure or onto the second roller and from the second roller onto the first structure, to arrange (position) the remaining portion of the second structure at a second position relative to the first roller, pick a second group of the plurality of ICs from the common support by selectively engaging each IC (e.g. the upper side of each IC) of that second group with said IC-engaging features, transfer said second group of ICs from the first roller onto the first structure or onto the second roller and transfer said second group of ICs from the second roller onto the first structure.

78. An apparatus according to clause 77, wherein arranging the remaining portion of the second structure at a second position relative to the first roller comprises indexing the second structure in the first direction to provide an offset relative to the first position of the second structure 79. An apparatus according to any one of clauses 70 to 78, wherein the regular array of ICs on the common support has a repetition interval of a distance D2 in a second direction, said second direction being perpendicular to the first direction, and the regular array of IC-engaging features on the first roller has a repetition interval of m×D2 in a corresponding second direction, where m is an integer greater than or equal to 2.

80. An apparatus according to clause 79, wherein said corresponding second direction is one of: a circumferential distance around the first roller (i.e. at a constant radius from the rotational axis of the first roller, in a plane perpendicular to the rotational axis); and a direction parallel to the rotation axis of the first roller.

81. An apparatus according to any one of clauses 77 to 80, wherein arranging the remaining portion of the second structure at a second position relative to the first roller comprises indexing the second structure in the second direction to provide an offset relative to the first position of the second structure.

82. An apparatus according to any one of clauses 49 to 81, wherein the first portions are arranged as a regular array in the first structure and m×D2 corresponds to a repetition interval of the groups of contact pads in a corresponding second direction on the first structure.

83. An apparatus according to any one of clauses 49 to 82, wherein the control means is arranged to transfer said ICs from the common support onto the first roller by rotating the first roller about the rotational axis of the first roller, and performing a relative translation between the common support and the rotation axis of first roller (e.g. in a direction perpendicular or transverse to the rotational axis of the first roller).

84. An apparatus according to any one of clauses 49 to 83, wherein the control means is arranged to transfer said ICs from the first roller onto the second roller by rotating the first roller about the rotational axis of the first roller, and rotating the second roller about the rotational axis of the second roller.

85. An apparatus according to any one of clauses 49 to 84, wherein the control means is arranged to transfer said ICs from the first roller onto the second roller by rotating the first roller in a first direction and rotating the second roller in an opposite direction.

86. An apparatus according to any one of clauses 49 to 85, wherein the control means is arranged to transfer said ICs from the second roller onto the first structure by rotating the second roller about the rotational axis of the second roller, and performing a relative translation between the first structure and the rotation axis of second roller (e.g. in a direction perpendicular or transverse to the rotational axis of the second roller).

87. An apparatus according to any one of clauses 49 to 86, wherein the second roller is arranged to pick said ICs from the first roller onto the second roller.

88. An apparatus according to any one of clauses 49 to 87, wherein the removable surface portion of the second roller is arranged to engage each IC to pick each IC from the first roller.

89. An apparatus according to any one of clauses 49 to 88, wherein the second roller comprises a plurality of IC-engaging features (structures, members, elements, protrusions, bodies), each arranged to engage and pick a respective IC from the first roller.

90. An apparatus according to clause 89, wherein each IC-engaging feature of the second roller is a feature extending radially outwards from (raised above, protruding from) the removable surface (e.g. substantially cylindrical surface) of the second roller.

91. An apparatus according to clause 89 or clause 90, wherein each IC-engaging feature of the second roller comprises a respective IC-engaging surface, each IC-engaging surface being arranged a common radial distance from the rotational axis of the second roller.

92. An apparatus according to clause 91, wherein each IC-engaging surface of the IC-engaging features of the second roller is resilient.

93. An apparatus according to any one of clauses 89 to 92, wherein each IC-engaging feature of the second roller is resilient.

94. An apparatus according to any one of clauses 49 to 88, wherein the second roller comprises a substantially smooth IC-engaging surface.

95. An apparatus according to any one of clauses 49 to 94, wherein the second roller comprises a cylindrical centre portion (e.g. a core).

96. An apparatus according to clause 95 wherein the surface of the cylindrical centre portion of the second roller comprises at least one aperture therein.

97. An apparatus according to clause 96, wherein the removable surface portion comprises at least one protrusion extending radially inwards from (raised above, protruding from) the innermost surface of the removable surface portion.

98. An apparatus according to any one of clauses 50 to 97, when dependent upon clause 50, wherein the control means is arranged to control the roller drive means and the first and second support means to transfer said ICs from the first roller onto the first structure by rotating the first roller about the rotational axis of the first roller, and performing a relative translation between the first structure and the rotation axis of first roller (e.g. in a direction perpendicular or transverse to the rotational axis of the first roller).

99. An apparatus according to any one of clauses 49 to 98, wherein said first structure is flexible.

100. An apparatus according to any one of clauses 49 to 99, wherein the first support means comprises a material transfer roller arranged to rotate about a third rotational axis, said third rotational axis being parallel to the first and, if present, the second rotational axis.

101. An apparatus according to clause 100, wherein a roller drive means (roller driving structure, assembly, system, mechanism, or at least one roller driver, for example comprising at least one drive motor) is controllable to drive the material transfer roller to rotate about its respective rotational axis.

102. An apparatus according to clause 100 or clause 101, wherein the control means is adapted to control the first support structure to translate said first structure (i.e. when supported by the first support means) relative to said third rotational axis.

103. An apparatus according to clause 102, wherein the control means is adapted to control the roller drive means to drive the material transfer roller to rotate about its respective rotational axis.

104. An apparatus according to any one of clauses 49 to 103, wherein the control means is arranged to control the roller drive means and the first and second support means to transfer said ICs from the first roller onto the second by rotating the first roller about the rotational axis of the first roller, and from the second roller onto the first structure by rotating the second roller about the rotational axis of the second roller in a direction opposite to the direction of rotation of the first roller, and performing a relative translation between the first structure and the rotation axis of second roller (e.g. in a direction perpendicular or transverse to the rotational axis of the second roller).

105. An apparatus according to any one of clauses 100 to 104, wherein the material transfer roller is configured to transfer the ICs to the first structure by supporting the second side of the first structure, opposite the first side, as the first structure passes the first roller or, if present, the second roller.

106. An apparatus according to any one of clauses 100 to 105, wherein the material transfer roller comprises a rubberised surface.

107. An apparatus according to clause 106, wherein the material transfer roller comprises a rubberised surface extending about the entire circumference of the roller.

108. An apparatus according to any one of clauses 100 to 107, wherein the material transfer roller is configured for continuous rotation about its respective rotational axis.

109. An apparatus according to any one of clauses 49 to 108, wherein the first support means further comprises a first roll for supporting the first structure, and a second roll for supporting the first structure, the control means being adapted to control the first support structure to transfer the first structure from the first roll onto the second roll.

110. An apparatus according to clause 109, wherein the control means is further arranged to control the roller drive means and first and second support means to transfer the ICs from the second roller onto the first structure while (during) transferring the first structure from the first roll onto the second roll.

111. An apparatus according to clause 109 or clause 110, wherein the first structure is passed over the material transfer roller between transferring of the first structure from the first roll onto the second roll.

112. An apparatus according to any one of clauses 49 to 111, the apparatus further comprises providing a third roll (e.g. a backing removal spindle) arranged to rotate about a fourth rotatable axis and adapted to receive a backing layer which is removed from said first structure before transferring the first structure between the first roll and the second roll.

113. An apparatus according to any one of clauses 49 to 112, wherein the apparatus further comprises providing a fourth roll (e.g. a backing application spindle) arranged to rotate about a fifth rotatable axis and adapted to provide a backing layer to said first structure from the fourth roll after the ICs are transferred onto the first structure.

114. An apparatus according to clause 113, wherein the roller drive means are controllable to drive the third and fourth roll to rotate about their respective axis.

115. An apparatus according to any one of clauses 113, wherein the roller drive means are controllable to drive the rotational axes of the first, second, third, fourth and fifth rollers.

116. An apparatus according to any one of clauses 49 to 115, comprising a camera.

117. An apparatus according to any one of clauses 49 to 116, comprising a programmable CPU (e.g. a PC, laptop computer or the like).

118. An apparatus according to clause 117, wherein the CPU is programmed with software to implement an IC transfer method according to any one of clauses 1 to 48.

119. An apparatus according to clause 117 or clause 118, comprising an operator interface operably connected to the CPU and being operable to allow operator inputs and to provide outputs to the operator.

120. A method of manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the method comprising:

providing (e.g. manufacturing) a first structure comprising the plurality of first portions (e.g. said first structure having a first surface (side) and the groups of contact pads being arranged at the first surface (side));

providing (e.g. manufacturing) a second structure comprising the plurality of ICs and a common support arranged to support the plurality of ICs such that each group of terminals faces away from the common support (e.g. each IC having a nominal upper side, at which the respective group of terminals is provided, and a nominal lower side (which implies that the ICs are generally flat, in contrast to old fashioned chips with legs), the ICs being supported on the common support such that each lower side faces the support and each group of terminals faces away from the support);

transferring said ICs from the common support onto a first roller, such that when each IC is supported on the first roller the respective group of terminals faces towards the first roller (e.g. faces towards a surface of the first roller, or, equivalently, faces radially inwards, towards a rotational axis of the first roller;

transferring said ICs from the first roller onto a second roller, such that when each IC is supported on the second roller the respective group of terminals faces away from the second roller (e.g. away from a surface of the second roller, i.e. faces radially outwards, away from a rotational axis of the second roller); and transferring said ICs from the second roller onto the first structure such that each group of terminals is mounted on (brought into electrical contact with) a respective group of contact pads.

121. An apparatus arranged to implement the method and clause 120.

122. A method of manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the method comprising:

providing (e.g. manufacturing) a first structure comprising the plurality of first portions (e.g. said first structure having a first surface (side) and the groups of contact pads being arranged at the first surface (side));

providing (e.g. manufacturing) a second structure comprising the plurality of ICs and a common support arranged to support the plurality of ICs such that each group of terminals faces towards the common support (e.g. each IC having a nominal upper side, at which the respective group of terminals is provided, and a nominal lower side (which implies that the ICs are generally flat, in contrast to old fashioned chips with legs), the ICs being supported on the common support such that each upper side faces the support and each group of terminals faces towards the support);

transferring said ICs from the common support onto a first roller, such that when each IC is supported on the first roller the respective group of terminals faces away from the first roller (e.g. faces away from a surface of the first roller, or, equivalently, faces radially outwards, away from a rotational axis of the first roller; and transferring said ICs from the first roller onto the first structure such that each group of terminals is mounted on (brought into electrical contact with) a respective group of contact pads.

123. An apparatus arranged to implement the method of clause 122.

The invention claimed is:

1. A method of manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the method comprising:

providing a first structure comprising the plurality of first portions;

providing a second structure comprising the plurality of ICs and a common support arranged to support the plurality of ICs;

transferring said ICs from the common support onto a first roller having a removable surface portion by picking said ICs from the common support with the first roller, wherein said picking comprises engaging each IC with a respective one of a plurality of IC-engaging features provided on the removable surface portion of the first roller; and transferring said ICs from the first roller onto the first structure such that each group of terminals is mounted on (brought into electrical contact with) a respective group of contact pads, wherein the plurality of ICs are arranged as a regular array on the common support, with a repetition interval of a distance D1 in a first direction, and the plurality of IC-engaging features are arranged as a regular array on the removable surface portion of the first roller with a repetition interval (distance, period) of n×D1 in a corresponding first direction, where n is an integer greater than or equal to 2, and the method comprises arranging the second structure at a first position relative to the first roller, and picking a first group of the plurality of ICs from the common support.

2. A method of manufacturing a plurality of electronic circuits, according to claim 1 comprising:

transferring said ICs from the first roller onto a second roller having a removable surface portion; and transferring said ICs from the second roller onto the first structure such that each group of terminals is mounted on and brought into electrical contact with a respective group of contact pads.

3. A method according to claim 1, wherein said removable surface portion is a formed sheet, optionally wherein said formed sheet is an elastomeric sheet, a rubber sheet or a silicone sheet.

4. A method according to claim 1, wherein said removable surface portion is wrapped around a first roller cylindrical centre portion.

5. A method according to claim 2, wherein separate removable surface portions are wrapped around a first roller cylindrical centre portion and a second roller cylindrical centre portion respectively.

6. A method according to claim 2, wherein the step of picking a first group of the plurality of ICs from the common support comprises selectively engaging each IC of that first group with said IC-engaging features, transferring said first group of ICs from the first roller onto the first structure or onto the second roller and then from the second roller onto the first structure.

7. A method according to claim 1, wherein the first portions are arranged as a regular array in the first structure and n×D1 corresponds to a repetition interval of the groups of contact pads in a corresponding first direction on the first.

8. A method according to claim 1, wherein the regular array of ICs on the common support has a repetition interval of a distance D2 in a second direction, said second direction being perpendicular to the first direction, and the regular array of IC-engaging features on the first roller has a repetition interval of m×D2 in a corresponding second direction, where m is an integer greater than or equal to 2.

9. A method according to claim 1, wherein the first portions are arranged as a regular array in the first structure and m×D2 corresponds to a repetition interval of the groups of contact pads in a corresponding second direction on the first structure.

10. A method according to claim 1, wherein transferring said ICs from the common support onto the first roller comprises: rotating the first roller about a rotational axis of the first roller; and performing a relative translation between the common support and the rotational axis of first roller.

11. A method according to claim 2, wherein said picking comprises engaging each IC with a respective one of a plurality of IC-engaging features provided on the removable surface portion of the second roller, optionally wherein each IC-engaging feature on the second roller is a feature extending radially outwards from the removable surface portion of the second roller, further optionally wherein each IC-engaging feature is formed on the removable surface portion of the second roller.

12. An apparatus for manufacturing a plurality of electronic circuits, each electronic circuit comprising a respective first portion, comprising a respective group of contact pads, and a respective integrated circuit, IC, comprising a respective group of terminals and mounted on the respective group of contact pads with each terminal in electrical contact with a respective contact pad, the apparatus comprising:

a first roller arranged to rotate about a first rotational axis and having a removable surface portion, the first roller comprising a plurality of IC-engaging features each arranged to engage and pick a respective IC from the common support onto the first roller;

roller drive system comprising at least one drive motor controllable to drive the roller to rotate about its respective rotational axis;

a first support assembly configured to support a first structure comprising the plurality of first portions and controllable to translate said first structure when supported by the first support assembly relative to said first rotational axis;

a second support assembly configured to support a second structure, comprising the plurality of ICs and a common support arranged to support the plurality of ICs, and controllable to translate said second structure when supported by the second support assembly relative to said first rotational axis; and at least one controller arranged to control the roller drive means and first and second support means to transfer said ICs from the common support onto the first roller, transfer said ICs from the first roller onto the first structure such that each group of terminals is mounted on brought into electrical contact with a respective group of contact pads, wherein the controller is arranged to rotate the first roller to pick said ICs from the common support onto the first roller, and wherein the second support assembly is adapted to support a second structure in which the plurality of ICs are arranged as a regular array on the common support, with a repetition interval of a distance D1 in a first direction, and the plurality of IC-engaging features are arranged as a regular array on the first roller with a repetition interval (distance, period) of n×D1 in a corresponding first direction, where n is an integer greater than or equal to 2, and the controller is adapted to control the roller drive system second support assembly, and first support assembly to position the second structure at a first position relative to the first roller, and pick a first group of the plurality of ICs from the common support.

13. An apparatus according to claim 12, comprising a second roller arranged to rotate about a second rotational axis and having a removable surface portion, said second rotational axis being parallel to the first rotational axis; wherein the roller drive system is controllable to drive the rollers to rotate about their respectively rotational axes; and wherein the at least one controller is arranged to control the roller drive means and first and second support means to transfer said ICs from the common support onto the first roller, transfer said ICs from the first roller onto the second roller, and transfer said ICs from the second roller onto the first structure such that each group of terminals is mounted on and brought into electrical contact with a respective group of contact pads.

14. An apparatus according to claim 12, wherein said, or each, removable surface portion is a formed sheet, optionally wherein the, or each, formed sheet is an elastomeric sheet, a rubber sheet or a silicone sheet.

15. An apparatus according to claim 12, wherein said removable surface portion of the first roller is wrapped around the first roller cylindrical centre portion.

16. An apparatus according to claim 13, wherein separate removable surface portions are wrapped around the first roller cylindrical centre portion and the second roller cylindrical centre portion respectively.

17. An apparatus according to claim 13, wherein the at least one controller is adapted to pick a first group of the plurality of ICs from the common support by selectively engaging each IC of that first group with said IC-engaging features, transfer said first group of ICs from the first roller onto the first structure or onto the second roller, and transfer said first group from the second roller onto the first structure.

18. An apparatus according to claim 12, wherein the second support assembly comprises a first carriage mounted on rails, optionally wherein a second carriage is mounted onto the first carriage, further optionally wherein the second carriage is moveable in a direction perpendicular to and in a parallel plane to the movement of the first carriage.

19. An apparatus according to claim 12, wherein the regular array of ICs on the common support has a repetition interval of a distance D2 in a second direction, said second direction being perpendicular to the first direction, and the regular array of IC-engaging features on the first roller has a repetition interval of m×D2 in a corresponding second direction, where m is an integer greater than or equal to 2.

20. An apparatus according to claim 13, wherein the at least one controller is arranged to transfer said ICs from the second roller onto the first structure by rotating the second roller about the rotational axis of the second roller, and performing a relative translation between the first structure and the rotation axis of second roller wherein the second roller comprises a plurality of IC-engaging features each arranged to engage and pick a respective IC from the first roller, further wherein each IC-engaging feature of the second roller is a feature extending radially outwards from the removable surface of the second roller.

* * * * *